United States Patent
Shinbo et al.

(10) Patent No.: US 6,493,928 B1
(45) Date of Patent: Dec. 17, 2002

(54) ELECTRONIC UNIT MANUFACTURING APPARATUS

(75) Inventors: Toshiharu Shinbo, Aichi (JP); Kazuhiko Tsuyama, Aichi (JP); Toshinobu Miki, Gifu (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/071,607

(22) Filed: May 1, 1998

(30) Foreign Application Priority Data

May 12, 1997 (JP) .................................... 9-120610
Mar. 25, 1998 (JP) ........................................ 10-077055

(51) Int. Cl.⁷ ............................ B23P 19/00; H05K 3/34
(52) U.S. Cl. ............................ 29/741; 29/711; 29/742; 29/843; 228/233.2; 228/234.1; 228/180.1; 118/121; 118/103
(58) Field of Search .......................... 29/711, 741, 742, 29/840, 843, 832, 860; 228/46, 8, 233.2, 234.1, 180.1; 118/121, 103, 419

(56) References Cited

U.S. PATENT DOCUMENTS

| | | | | |
|---|---|---|---|---|
| 3,776,771 A | * | 12/1973 | Shepard ...................... | 118/121 |
| 4,628,594 A | * | 12/1986 | Yamagami et al. ............ | 29/741 |
| 4,905,371 A | * | 3/1990 | Pai ............................... | 29/840 |
| 5,141,147 A | * | 8/1992 | Yokota ........................ | 228/219 |
| 5,155,904 A | * | 10/1992 | Majd ........................... | 29/843 |
| 5,498,575 A | * | 3/1996 | Onishi et al. ................. | 29/840 |
| 5,593,080 A | * | 1/1997 | Teshima et al. .............. | 29/840 |
| 5,659,947 A | * | 8/1997 | Eilers et al. .................. | 29/742 |
| 5,671,531 A | * | 9/1997 | Mugiya ........................ | 29/840 |
| 5,785,233 A | * | 7/1998 | Nutter et al. ................. | 228/46 |
| 5,993,500 A | * | 11/1999 | Bailey et al. ................. | 228/42 |

FOREIGN PATENT DOCUMENTS

| | | | | |
|---|---|---|---|---|
| JP | 4-245495 | * | 9/1992 | ................... 29/840 |
| JP | 5-259631 | * | 10/1993 | ................... 29/840 |

OTHER PUBLICATIONS

U.S. patent application No. 09/071,610, Filed May 1, 1998, Title: Electronic Unit Soldering Apparatus, Inventor: Toshiharu Shinbo et al.

* cited by examiner

Primary Examiner—Peter Vo
Assistant Examiner—A. Dexter Tugbang
(74) Attorney, Agent, or Firm—Pearne & Gordon LLP

(57) ABSTRACT

An electronic unit manufacturing apparatus includes: a cream solder printer for printing cream solder on one side of a printed-circuit board; a chip placement machine for placing a plane-mounted part on the printed-circuit board on which the cream solder is printed; a first reflow furnace for fixedly securing the plane-mounted part to the printed-circuit board; a solder application machine for applying a larger amount of cream solder than that printed by the cream solder printer in the vicinity of holes made in the one side of the printed-circuit board; and a second reflow furnace for inserting pins of a deformed part into the holes made in the printed-circuit board from an opposite side thereof and fixedly securing the pins of the deformed part to the printed-circuit board, wherein in the second reflow furnace. In the second reflow furnace, temperature on the opposite side of the printed-circuit board is set lower than temperature on the one side thereof.

41 Claims, 21 Drawing Sheets

ELECTRONIC UNIT MANUFACTURING APPARATUS

BACKGROUND OF THE INVENTION

1. Field of the Invention

This invention relates to an electronic unit manufacturing apparatus and method for reflow soldering.

2. Description of the Related Art

A conventional electronic unit manufacturing apparatus and method will be discussed. As shown in FIG. 32, the conventional electronic unit manufacturing apparatus using the conventional electronic unit manufacturing method includes an adhesive printer 1 for printing an adhesive on a printed-circuit board, a chip placement machine 2 for placing chips on the printed-circuit board on which the adhesive is printed by the adhesive printer 1, a drier 3 for drying the printed-circuit board on which the chips are placed by the chip placement machine 2, and a deformed part insertion machine 4 for inserting deformed parts such as a coil, a capacitor, and an IFT transformer into the printed-circuit board dried by the drier 3. The printed-circuit board into which the deformed parts are inserted by the deformed part insertion machine 4 is inserted into a metal frame and frame assembling 5 is executed, then batch soldering is performed on a solder dip layer 6 to finish manufacturing the electronic unit. The reason why the conventional electronic unit manufacturing apparatus using the conventional electronic unit manufacturing method cannot accomplish reflow soldering with good soldering quality is that if non-heat-resistant parts easily affected by high temperature, such as an electrolytic capacitor and an IFT transformer, of the deformed parts inserted into the printed-circuit board are reflow-soldered at the same time as the chips, the parts are destroyed due to reflow heat.

However, for the adhesive printer 1 to print an adhesive on a printed-circuit board in the conventional manufacturing apparatus using the solder dip layer 6 to protect the non-heat-resistant parts, as shown in FIG. 33, if the amount of an adhesive 8a printed on a printed-circuit board 7 is small, a small bonding force is provided. Thus, a chip 9 may drop from the printed-circuit board 7 before dip-soldering is performed in the solder dip layer 6. If the adhesive amount is large, the adhesive squeezes out from the chip 9 as adhesive 8b. Resultantly, as shown in FIG. 34, solderability of solder 10 is poor and chips 9 may drop from the printed-circuit board 7. In soldering using the solder dip layer 6, inevitably a short circuit caused by a solder bride 11, a discontinuous part 12 not soldered, and the like occur as shown in FIG. 35; the worker must correct the defects by manual soldering in the later process.

SUMMARY OF THE INVENTION

It is therefore an object of the invention to provide an electronic unit manufacturing apparatus for protecting non-heat-resistant parts from high temperature and providing good soldering quality for lessening correction work.

To solve the above object, there is provided an electronic unit manufacturing apparatus includes: a cream solder printer for printing cream solder on one side of a printed-circuit board; a chip placement machine for placing a plane-mounted part on the printed-circuit board on which the cream solder is printed; a first reflow furnace for fixedly securing the plane-mounted part to the printed-circuit board; a solder application machine for applying a larger amount of cream solder than that printed by the cream solder printer in the vicinity of holes made in the one side of the printed-circuit board; and a second reflow furnace for inserting pins of a deformed part into the holes made in the printed-circuit board from an opposite side thereof and fixedly securing the pins of the deformed part to the printed-circuit board, wherein in the second reflow furnace. In the second reflow furnace, temperature on the opposite side of the printed-circuit board is set lower than temperature on the'one side thereof.

Thus, when the electronic unit is manufactured, the non-heat-resistant parts are protected from high temperature heat and good soldering quality is provided for drastically lessening correction work.

DETAILED DESCRIPTION OF THE PREFERRED EMBODIMENTS

Figure 1:
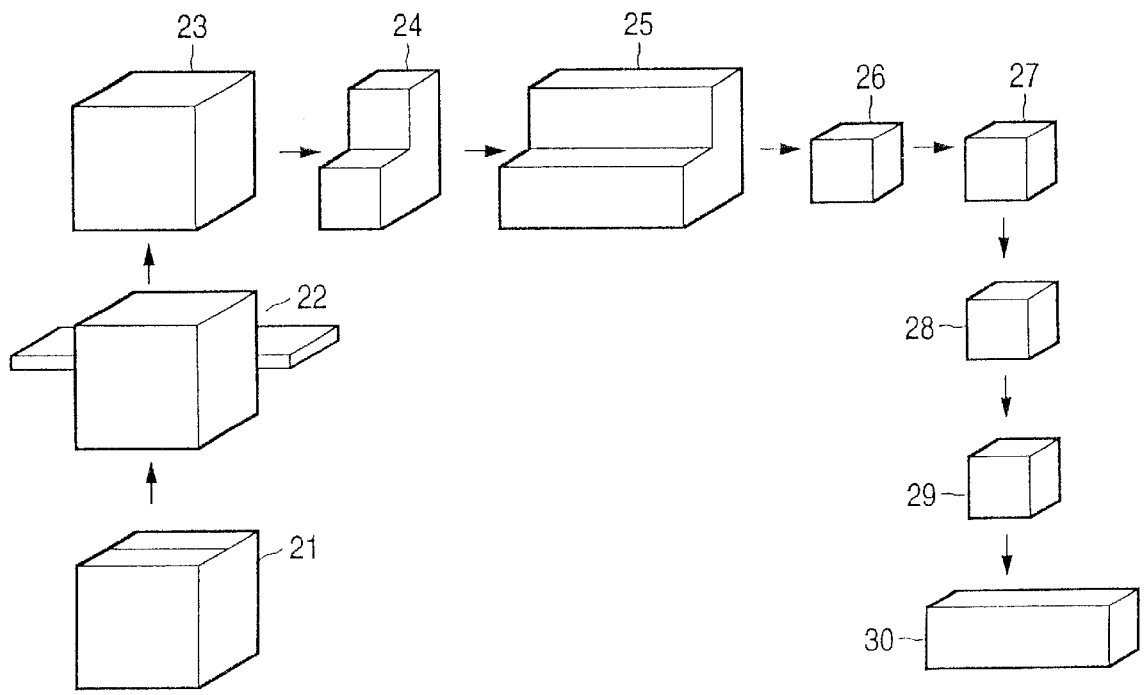
FIG. 1 is a schematic representation of an electronic unit manufacturing apparatus and method in one embodiment of the invention.

Referring now to the accompanying drawings, there are shown preferred embodiments of the invention. FIG. 1 is a schematic representation of an electronic unit manufacturing apparatus and method in one embodiment of the invention.

In FIG. 1, numeral 21 is a cream solder printer for printing cream solder on one side of a printed-circuit board. Chips are placed by a chip placement machine 22 for placing chips (used as plane-mounted parts) at the cream solder print positions on the printed-circuit board on which cream solder is printed by the cream solder printer 21. Next, in a reflow furnace 23, the printed-circuit board on which the chips are placed is heated for fusing the cream solder to join the chips to a pattern, then is cooled for fixedly securing the chips thereon. Deformed part placement cream solder is applied by a solder application machine 24 to the neighborhoods of holes in one side of the printed-circuit board to which the chips are fixedly secured. A larger amount of cream solder than the amount of the cream solder printed by the cream solder printer 21 is applied to the side of the printed-circuit board. Pins of deformed parts (parts having pins other than plane-mounted parts) are inserted into the holes of the printed-circuit board from the opposite side thereof by a deformed part insertion machine 25. The printed-circuit board into which the deformed parts are inserted is inserted into a frame by a frame assembling machine 26. Cream solder is applied between the printed-circuit board and the frame by a cream solder application machine 27 of the same type as the solder application machine 24. Next, the printed-circuit board is caulked to the frame by a caulking machine 28. Cream solder is applied to the root of an input terminal placed in the frame by a dispenser 29. Last, the frame and the printed-circuit board and the printed-circuit board and the deformed parts, etc., are fixedly secured in a reflow furnace 30 to complete an electronic unit.

Since the chips and the deformed parts are fixedly secured to the printed-circuit board in the reflow furnaces 23 and 30, defects of an unsoldered portion, a solder bridge, etc., are extremely reduced. Resultantly, correction work in the later process is very lessened. That is, for the electronic unit thus reflow-soldered, manual solder correction work in the later process is extremely lessened (to about 1/40 of dip soldering, namely, the defect percentage decreased from 0.8% to about 0.02%) as compared with the electronic unit dip-soldered by the conventional method. Good soldering quality can be immediately understood simply by seeing the appearance.

Since the chips are first fixedly secured to the printed-circuit board in the reflow furnace 23, they do not drop from the printed-circuit board in the manufacturing step following that step. Therefore, the correction work in the later process also lessens in this point. Further, the deformed parts are inserted by the deformed part insertion machine 25, so that good workability is provided.

Figure 2:
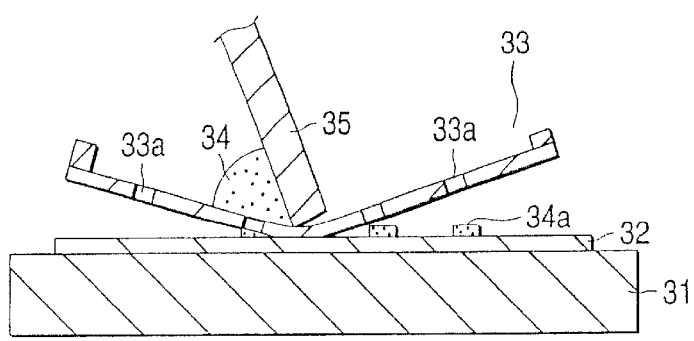
FIG. 2 is a sectional view of the main part of a cream solder printer in the embodiment of the invention.

FIG. 2 is a sectional view of the main part of the cream solder printer 21. In the figure, numeral 31 is a base on which a printed-circuit board 32 is placed. A screen 33 is disposed above the printed-circuit board 32 and is formed with holes 33a for printing cream solder on the printed-circuit board 32. Numeral 34 is cream solder poured into the screen 33. A squeegee 35 slides over the screen 33, whereby the cream solder 34 is transferred to the printed-circuit board 32 through the holes 33a made in the screen 33. Numeral 34a is cream solder transferred to and printed on the printed-circuit board 32. It is important to provide a small gap (0.01–2 mm) between the screen 33 and the printed-circuit board 32. The squeegee 35 exerts pressure of 2.0–6.0 kg/cm² on the base 31, whereby the cream solder 34 can be reliably transferred to and printed on the printed-circuit board 32.

Figure 3:
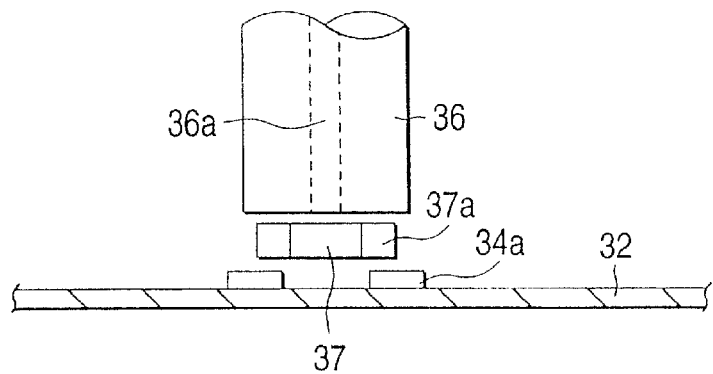
FIG. 3 is a sectional view of the main part of a chip placement machine in the embodiment of the invention.

FIG. 3 is a sectional view of the main part of the chip placement machine 22. In the figure, numeral 36 is a nozzle. A drawing hole 36a is made roughly at the center of the nozzle 36. The drawing hole 36a is evacuated, whereby chips 37 are absorbed and taken out from a part supply section (not shown) one at a time and placed on the cream solder 34a of the printed-circuit board 32. Numeral 37a is a chip electrode. The electrode 37a is placed on the cream solder 34a. It is important to abut the drawing hole 36a roughly against the center-of-gravity position of the chip 37 for taking out the chip 37 from the part supply section. The drawing hole 36a is elliptic in cross section for enhancing the drawing force of the chip 37.

Figure 4A:
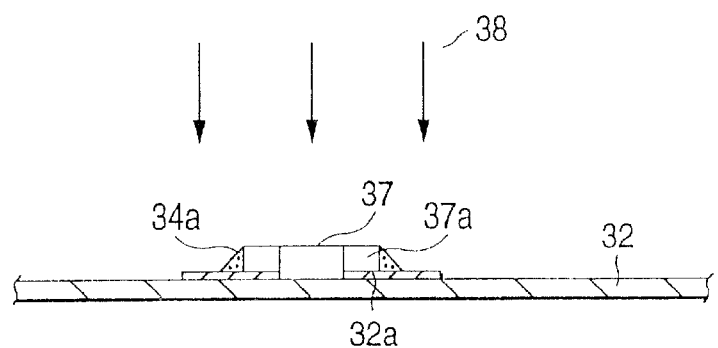
FIG. 4A is a sectional view of the main part of a first reflow furnace in the embodiment of the invention.
Figure 4B:
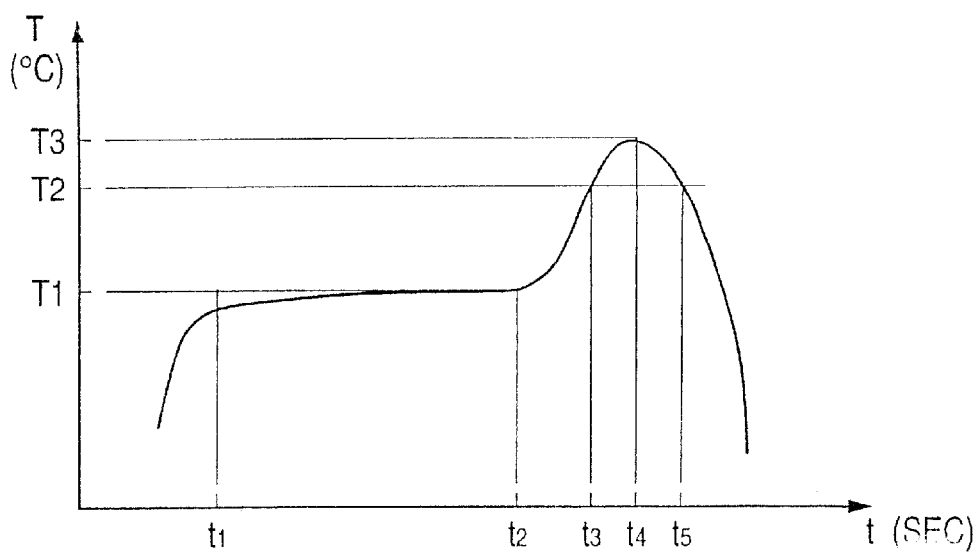
FIG. 4B is a temperature change chart in the reflow furnace in the embodiment of the invention.

FIG. 4A is a sectional view of the main part of the reflow furnace 23 and FIG. 4B is a temperature change chart in the reflow furnace. In FIG. 4A, numeral 38 is hot air. The electrode 37a of the chip 37 is fixedly secured to a copper foil pattern 32a of the printed-circuit board 32 with the cream solder 34a by heat of the hot air 38. FIG. 4B shows temperature change on the chip 37 placement side caused by the hot air 38. In FIG. 4B, vertical axis T is temperature (centigrade) and horizontal axis t is time (seconds). First, temperature T1 for about 90 seconds between t1 and t2 is held 100–160 degrees and temperature T2 for about 20 seconds between t3 and t5 is held 200 degrees or more. At this time, the highest temperature T3 is about 220–240 degrees. The chips 37 are fixedly secured strongly to the printed-circuit board 32 by performing such temperature control in the reflow furnace 23.

Figure 5:
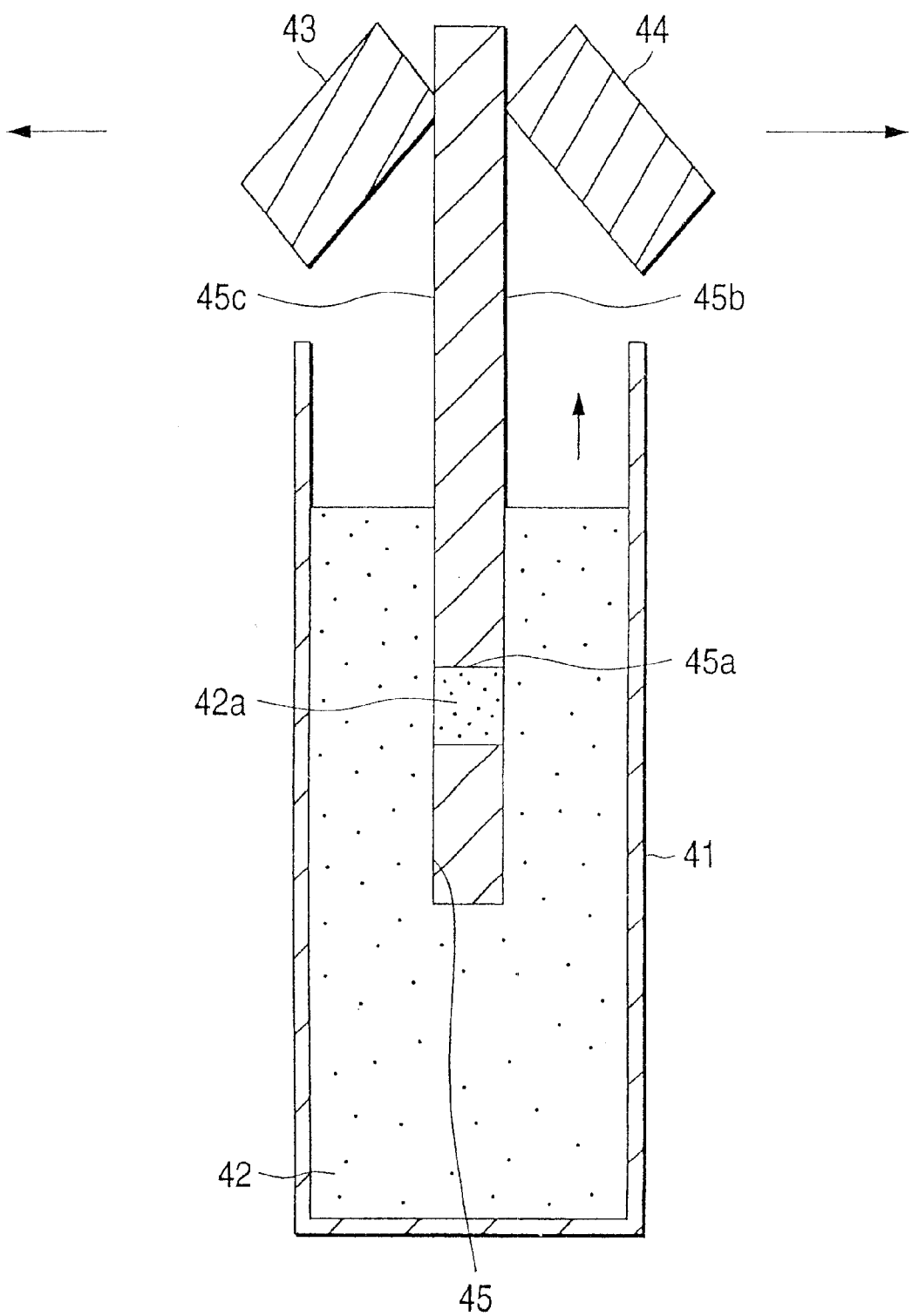
FIG. 5 is a sectional view of the main part of a solder application machine in a first state thereof in the embodiment of the invention.

FIG. 5 is a sectional view of the main part of the solder application machine 24 in the proximity of a tank to describe a first state of the solder application machine 24. In the figure, numeral 41 is a stainless tank opened on the top. The tank 41 is filled with cream solder 42. Numerals 43 and 44 are two squeegees made of stainless material (or resin) disposed above the tank 41. The squeegees 43 and 44 are disposed so that they can move in the horizontal direction toward and away from each other. Numeral 45 is a stainless imprint plate. First, the two squeegees 43 and 44 are moved away from each other and the imprint plate 45 is brought down therebetween and is inserted into the cream solder 42 in the tank 41. At this time, cream solder 42a is filled into a hole 45a made in the imprint plate 45; the amount of the filled cream solder 42a is about 5–40 times the amount of the cream solder 34a for chip print. A large amount of solder becomes necessary because pins of deformed parts are soldered.

Next, the two squeegees 43 and 44 are moved toward each other and are abutted against the surface of the imprint plate 45. In this state, the imprint plate 45 is pulled upward. At this time, the cream solder 42 deposited on a surface 45b and a rear face 45c of the imprint plate 45 is removed and restored to the tank 41 by means of the squeegees 43 and 44 and the cream solder 42a is filled into the hole 45a reliably. For this purpose, the lower face of the squeegee 43, 44 is inclined about 45 degrees downward with respect to the imprint plate 45. This angle may range from 30 to 60 degrees.

Figure 6:
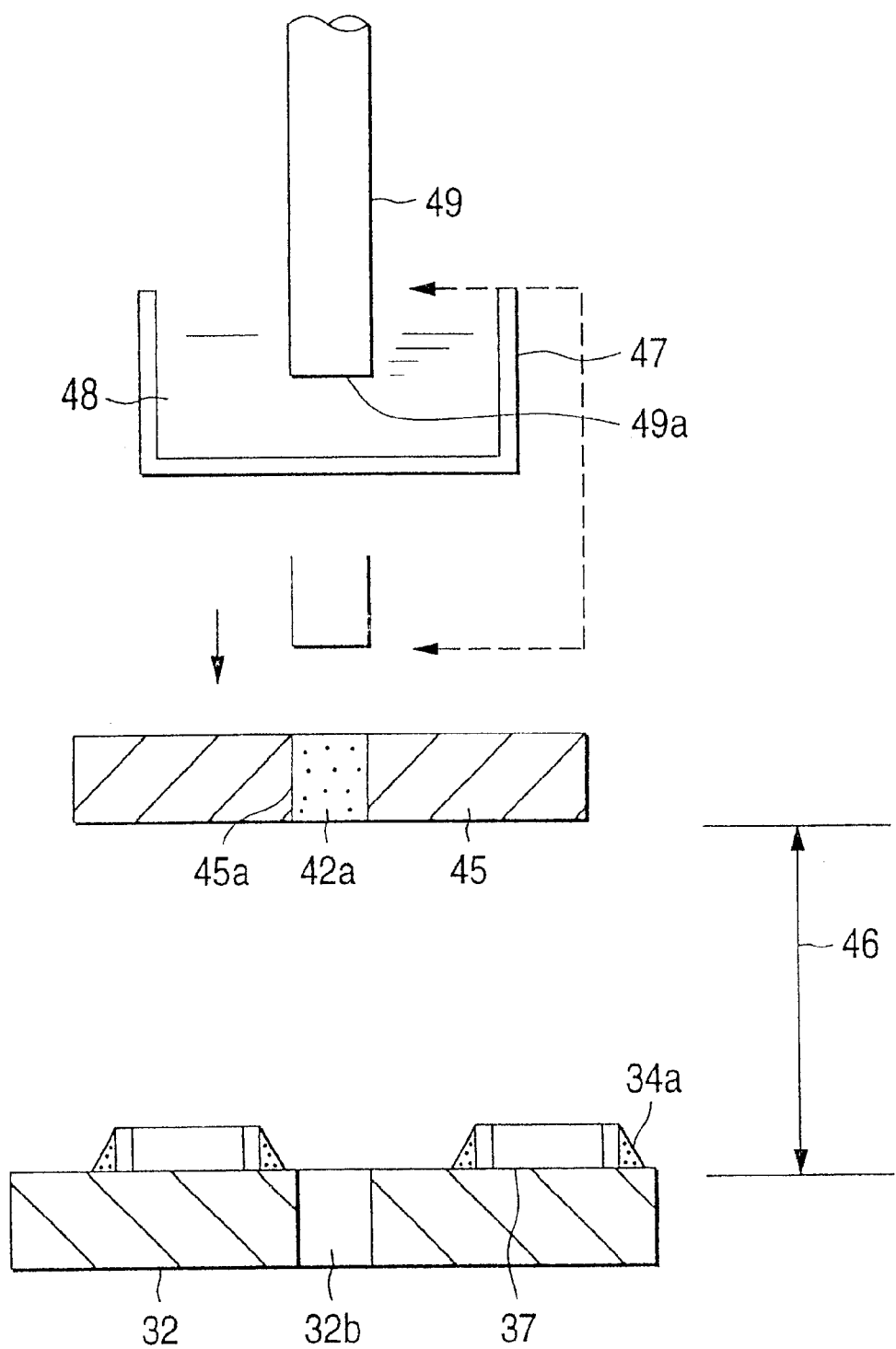
FIG. 6 is a sectional view of the main part of the solder application machine in a second state thereof in the embodiment of the invention.

FIG. 6 is a sectional view of the main part of the solder application machine 24 in the proximity of a solder application section in a second state of the solder application machine 24. In the figure, the imprint plate 45 drawn out from the tank 41 is placed above the printed-circuit board 32 in parallel therewith. At this time, spacing 46 between the printed-circuit board 32 and the imprint plate 45 is made larger than the height of the part fixedly secured to the printed-circuit board 32 (in this case, the chip 37), namely, is about 7 mm in the embodiment. Numeral 47 is a stainless vessel filled with isopropyl alcohol 48. Numeral 49 is a push pin. This push pin 49 is inserted into the vessel 47 and alcohol 48a is deposited on a tip 49a of the push pin 49, then the push pin 49 is dropped to the hole 45a of the imprint plate 45.

Figure 7:
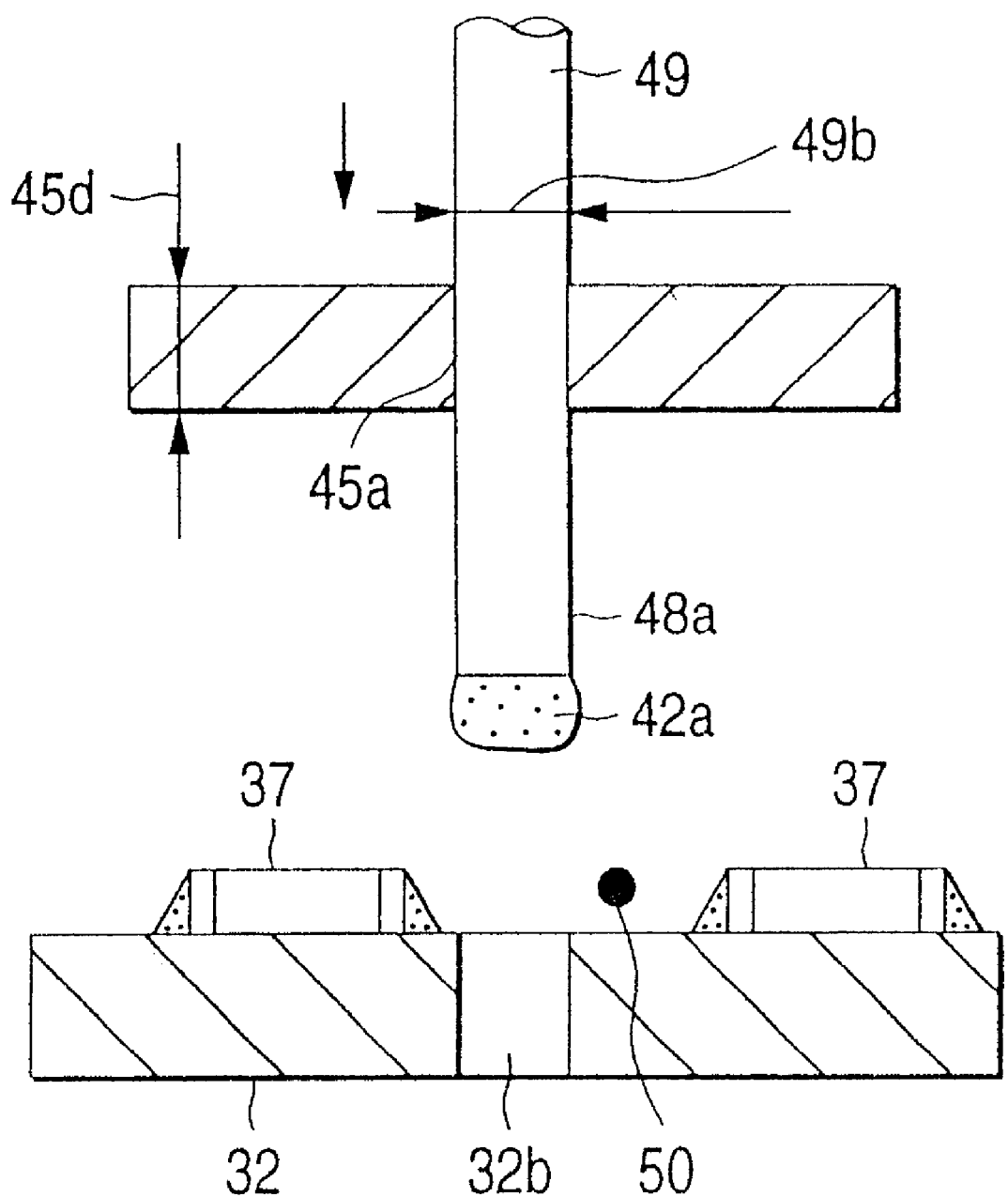
FIG. 7 is a sectional view of the main part of the solder application machine in a third state thereof in the embodiment of the invention.

Then, as shown in FIG. 7, a sectional view of the main part of the solder application machine 24 in the proximity of the solder application section in a third state of the solder application machine 24, the push pin 49 on which the cream solder 42a filled into the hole 45a of the imprint plate 45 is deposited is dropped to a hole 32b of the printed-circuit board 32 to insert a deformed part. At this time, thickness 45d of the imprint plate 45 is set to a value in the range of 0.7–1.5 mm depending on the type of deformed part to be inserted. A diameter 49b of the imprint plate 45 is set to a value in the range of 1.4–1.8 mm depending on the form of the deformed part to be inserted. The hole 45a has a diameter made slightly larger than the diameter of the push pin 49 so as to just fit the push pin 49. The thickness 45d of the imprint plate 45 and the diameter of the hole 45a are thus set, whereby a constant amount of the cream solder 42a always adheres to the tip 49a of the push pin 49. A space 50 between the chips 37 may be any size if the push pin 49 abuts the printed-circuit board 32, thus the space 50 may be made slightly larger than the diameter of the push pin 49; the packaging density of the chips 37 can be raised. Thus, the printed-circuit board 32 can be miniaturized, resulting in miniaturization of the electronic unit.

Figure 8:
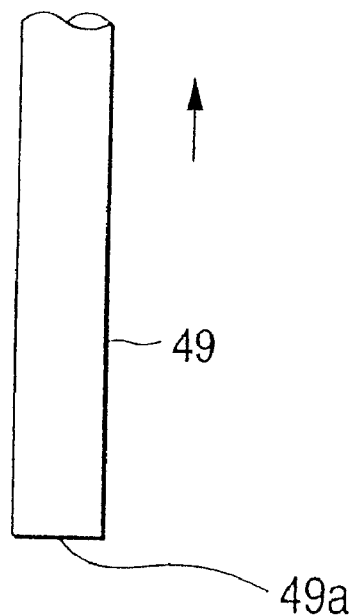
FIG. 8 is a sectional view of the main part of the solder application machine in a fourth state thereof in the embodiment of the invention.
Figure 8:
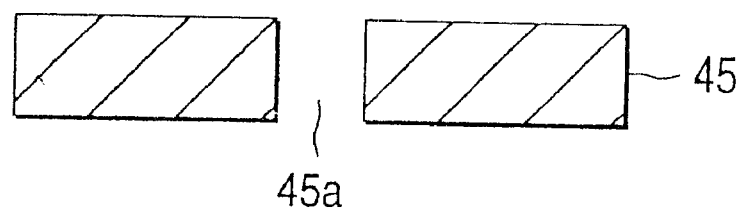
Figure 8:
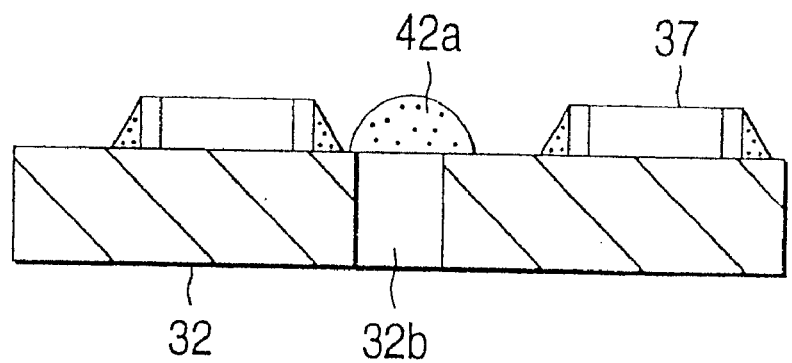

The constant amount of the cream solder 42a is thus deposited on the hole 32b of the printed-circuit board 32 to insert a deformed part, as shown in FIG. 8, a sectional view of the main part of the solder application machine 24 in the proximity of the solder application section in a fourth state of the solder application machine 24. At this time, the alcohol 48a is deposited between the tip 49a of the push pin 49 and the cream solder 42a, so that the cream solder 42a reliably adheres to the printed-circuit board 32 and is reliably separated from the tip 49a of the push pin 49. That is, the push pin 49 does not again lift up the cream solder 42a. After the cream solder 42a is applied, the push pin 49 again passes through the hole 45a, is lifted upward, and is again inserted into the tank 41.

Figure 9A:
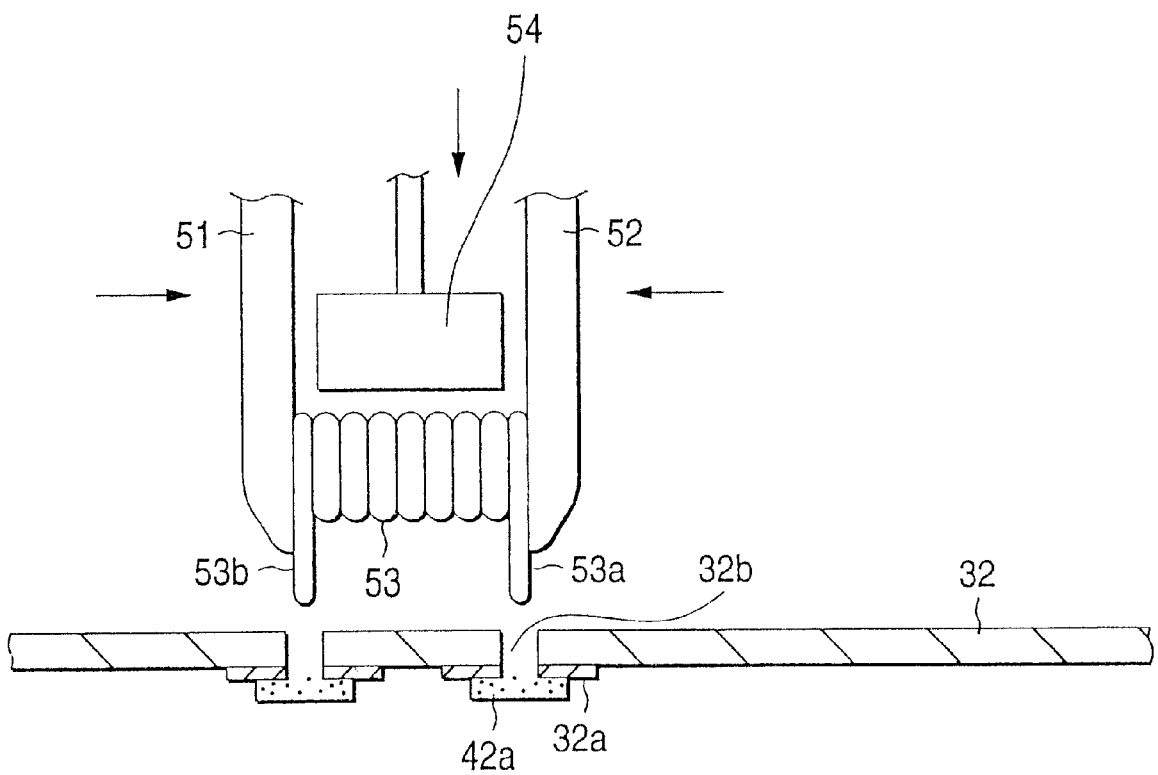
FIG. 9A is a side view of the main part of an automatic coil insertion machine of a deformed part insertion machine in the embodiment of the invention.
Figure 9B:
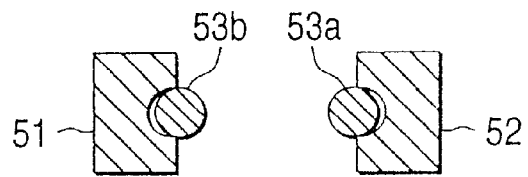
FIG. 9B is a sectional view of the main part of the automatic coil insertion machine in the embodiment of the invention.

FIG. 9A is a side view of the main part of an automatic coil insertion machine of the deformed part insertion machine 25 and FIG. 9B is a sectional view of the main part of the automatic coil insertion machine. In FIG. 9A, numerals 51 and 52 are iron guides disposed so that the guides 51 and 52 move in the horizontal direction toward and away from each other. The guides 51 and 52 hold a coil 53 of an inserted part, then stop above the holes 32b made in the printed-circuit board 32, next a pusher 54 pushes the coil 53 so as to insert pins 53a and 53b of the coil 53 into the holes 32b of the printed-circuit board 32. Numeral 42a is cream solder applied onto the copper foil pattern 32a. As shown in FIG. 9B, the abutment faces of the guides 51 and 52 on the pins 53a and 53b of the coil 53 are made concave and are finished to lessen frictional resistance for smoothly sliding the coil 53. The automatic coil insertion machine can automatically insert the elastic coil 53 which is hard to manually insert into the printed-circuit board 32; workability is improved.

Figure 10A:
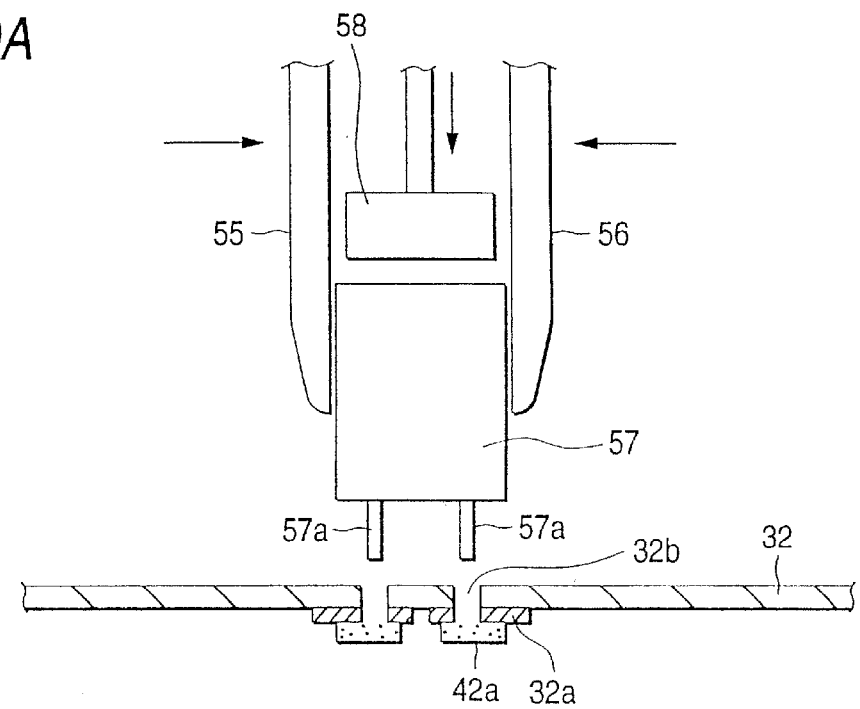
FIG. 10A is a side view of the main part of an automatic IFT transformer insertion machine of the deformed part insertion machine in the embodiment of the invention.
Figure 10B:
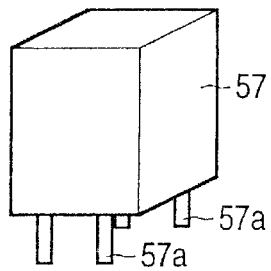
FIG. 10B is a perspective view of the IFT transformer in the embodiment of the invention.

FIG. 10A is a side view of the main part of an automatic IFT transformer insertion machine of the deformed part insertion machine 25 and FIG. 10B is a perspective view of the IFT transformer. In FIG. 10A, numerals 55 and 56 are iron guides disposed so that the guides 55 and 56 move in the horizontal direction toward and away from each other. The guides 55 and 56 hold an IFT transformer 57 of an inserted part, then stop above the holes 32b made in the printed-circuit board 32, next a pusher 58 pushes IFT transformer 57 so as to insert four pins 57a of the IFT transformer 57 into the holes 32b of the printed-circuit board 32. Numeral 42a is cream solder applied onto the copper foil pattern 32a. The abutment faces of the guides 55 and 56 against the sides of the IFT transformer 57 are finished to lessen frictional resistance for smoothly sliding the IFT transformer 57. The automatic IFT transformer insertion machine can automatically insert the easy-to-slide IFT transformer 57 hard to manually insert into the printed-circuit board 32; workability is improved.

Figure 11:
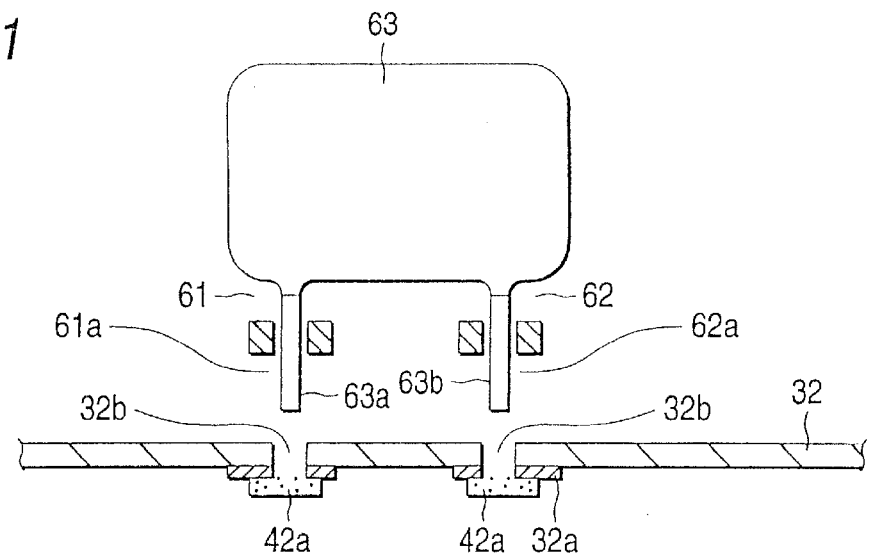
FIG. 11 is a side view of the main part of an automatic Mylar capacitor insertion machine of the deformed part insertion machine in the embodiment of the invention.

FIG. 11 is a side view of the main part of an automatic Mylar capacitor insertion machine of the deformed part insertion machine 25. In the figure, numerals 61 and 62 are iron guides having two pairs of holding parts 61a and 62a respectively moving in the horizontal direction toward and away from each other. The two pairs of holding parts 61a and 62a hold two pins 63a and 63b, respectively, of a Mylar capacitor 63 of an inserted part, then stop above the holes 32b made in the printed-circuit board 32, and the two pins 63a and 63b of the Mylar capacitor 63 are inserted into the holes 32b of the printed-circuit board 32. Numeral 42a is cream solder applied onto the copper foil pattern 32a. The abutment faces of the holding parts 61a and 62a of the guides 61 and 62 against the pins 63a and 63b of the Mylar capacitor 63 are finished so as not to damage the pins 63a and 63b. Thus, the Mylar capacitor 63 having an irregular outer form can also be inserted automatically into the printed-circuit board 32 by holding the pins 63a and 63b; workability is improved.

Figure 12A:
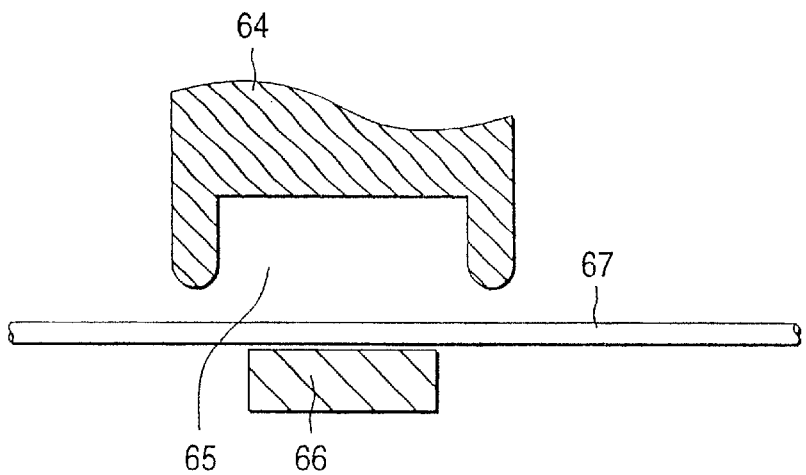
FIG. 12A is a sectional view of the main part of an automatic lead insertion machine of the deformed part insertion machine in a first state of the automatic lead insertion machine in the embodiment of the invention.
Figure 12B:
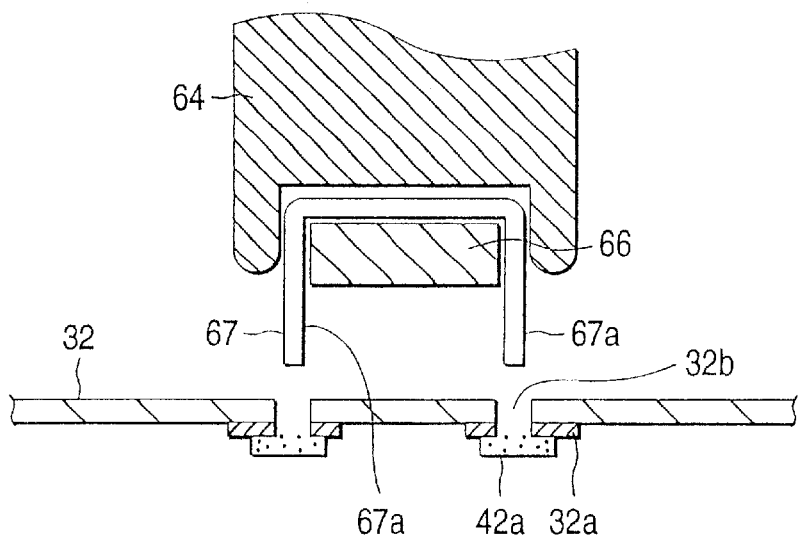
FIG. 12B is a sectional view of the main part of the automatic lead insertion machine in a second state thereof in the embodiment of the invention.

FIG. 12A is a sectional view of the main part of an automatic lead insertion machine of the deformed part insertion machine 25 in a first state of the automatic lead insertion machine and FIG. 12B is a sectional view of the main part of the automatic lead insertion machine in a second state thereof. In FIG. 12A, numeral 64 is an insertion guide formed at the bottom with a concave part 65 opened downward. Numeral 66 is a slider fitted into the concave part 65 via a lead wire 67. This state is shown in FIG. 12B. Next, the guide 64 is moved toward the holes 32b made in the printed-circuit board 32 and immediately the slider 66 is drawn out, just then tips 67a of the lead wire 67 are inserted into the holes 32b of the printed-circuit board 32. The surface of the slider 66 is finished to be smooth so that the slider 66 easily slides. Thus, the fine lead wire 67 which is hard to hold and manually insert can be inserted automatically into the printed-circuit board 32; workability is improved.

Figure 13:
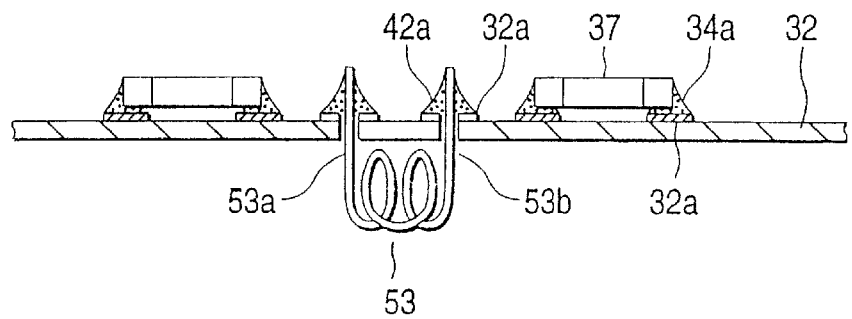
FIG. 13 is a sectional view of the printed-circuit board on which parts are placed in the embodiment of the invention.

In this state, as shown in FIG. 13, the printed-circuit board 32 has one side on which the chips 37 are reflow-soldered to the copper foil pattern 32a with the cream solder 34a and the opposite side on which the coil 53 is placed with the pins 53a and 53b thereof inserted into the holes 32b of the printed-circuit board 32. Numeral 42a is cream solder applied for fixedly securing the pins 53a and 53b of the coil 53 to the copper foil pattern 32a of the printed-circuit board 32.

Figure 14A:
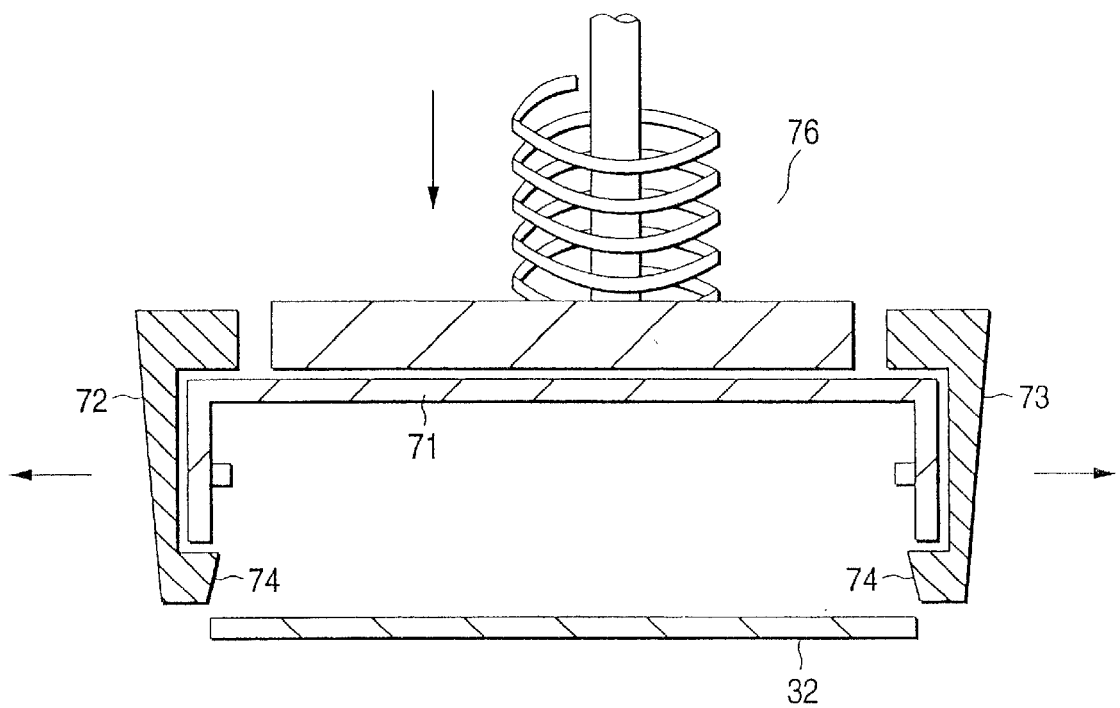
FIG. 14A is a sectional view of the main part of a frame assembling machine in the embodiment of the invention.
Figure 14B:
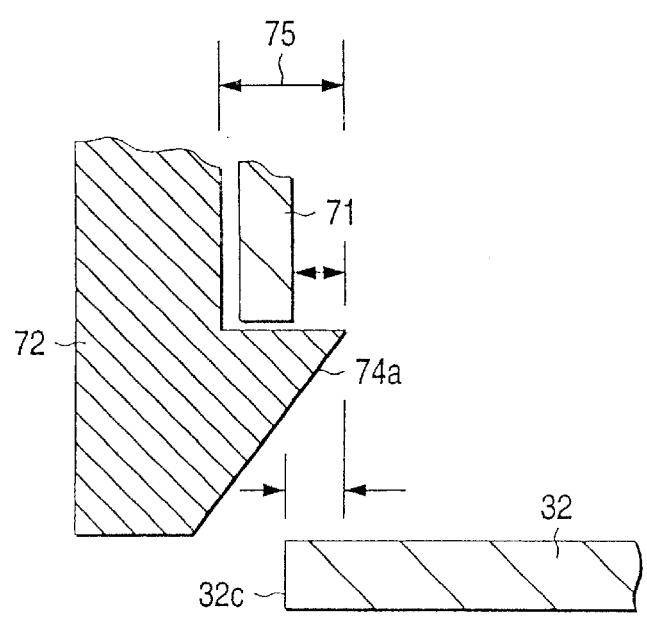
FIG. 14b is a partially enlarged sectional view thereof in the embodiment of the invention.

FIG. 14A is a sectional view of the main part of the frame assembling machine 26 and FIG. 14B is a partially enlarged sectional view thereof. In FIG. 14A, numeral 71 is a metal frame. Numeral 32 is the printed-circuit board inserted into the frame 71. Deformed parts such as the chips 37 and the coil 53 are placed on the printed-circuit board 32, as shown in FIG. 13. Numerals 72 and 73 are iron guides disposed so that the guides 72 and 73 can move in the horizontal direction toward and away from each other. The guides 72 and 73 hold the frame 71 and insert the frame 71 into the printed-circuit board 32. Numeral 74 is a claw provided at the lower end of the guide 72, 73. Height 75 of the claw 74 is made larger about 0.05 mm than the thickness of the frame 71, as shown in FIG. 14B. Likewise, it is also made larger about 0.05 mm than the position of a side end 32c of the printed-circuit board 32. The claw 74 has a taper 74a widening downward. The taper 74a is formed smooth so that the printed-circuit board 32 can be easily inserted into the frame 71. The printed-circuit board 32 is thus inserted into the frame 71 along the taper 74a and is pushed downward by a pusher 76.

Cream solder is applied to the space between the printed-circuit board 32 and the frame 71 by the cream solder application machine 27 (not shown). The cream solder application machine 27 has a similar configuration to that of the solder application machine 24. However, a push pin is immersed into an alcohol vessel so that alcohol adheres to the push pin, then the push pin is rotated 180 degrees and is moved from bottom to top for depositing cream solder between the printed-circuit board 32 and the frame 71. Thus, a step of placing the frame 71 in opposite orientation becomes necessary.

Figure 15:
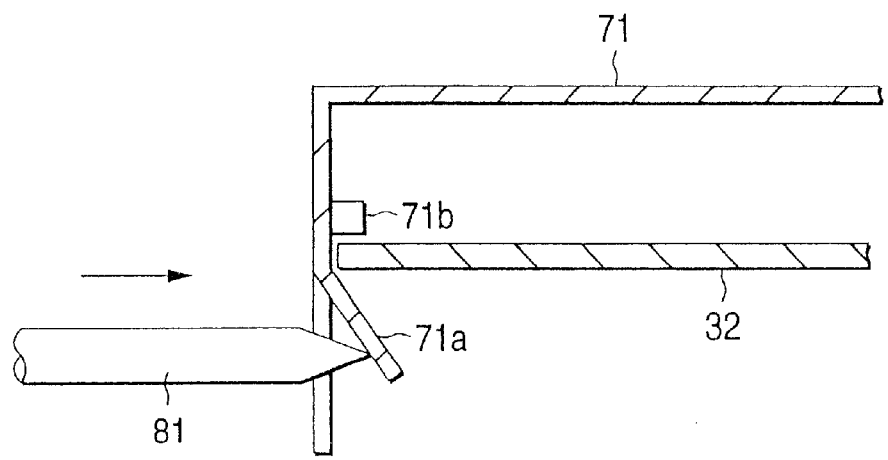
FIG. 15 is a sectional view of the main part of a caulking machine in the embodiment of the invention.

FIG. 15 is a sectional view of the main part of the caulking machine 28. Numeral 81 is a push rod for pushing up a piece 71a formed in the frame 71 so as to fix the printed-circuit board 32 between the piece 71a and a support 71b formed on the frame 71.

Figure 16:
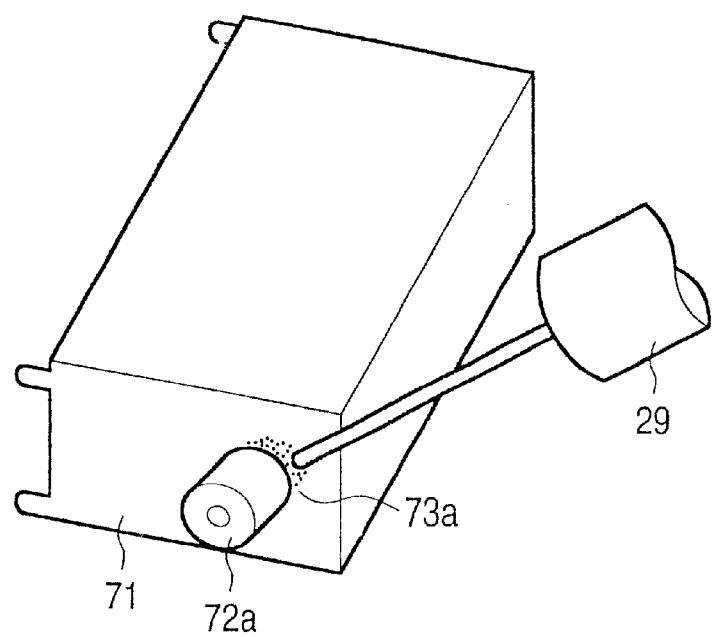
FIG. 16 is a perspective view of a dispenser and its neighborhood.

FIG. 16 shows the dispenser 29 for applying cream solder 73a to the root of an input terminal 72a disposed on the side of the frame 71.

Figure 17A:
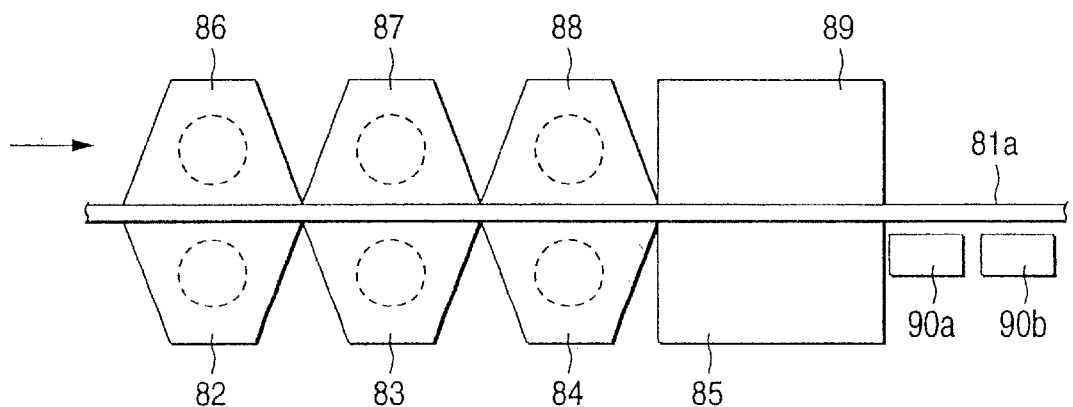
FIG. 17A is a side view of a second reflow furnace according to a first example in the embodiment of the invention.
Figure 17B:
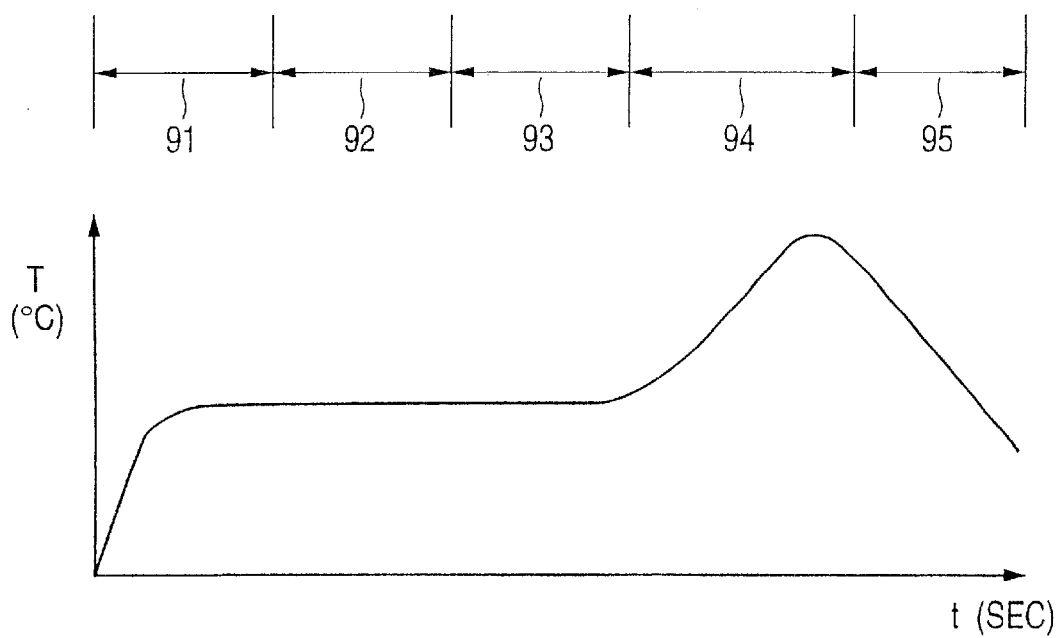
FIG. 17B is a temperature distribution chart in the reflow furnace in the embodiment of the invention.

FIG. 17A is a side view of a reflow furnace 30 and FIG. 17B is a temperature distribution chart in the reflow furnace. In FIG. 17A, numeral 81a is a conveyor as transport means on which an electronic unit (not shown) placed on a pallet (not shown) is transported. Numerals 82, 83, 84, and 85 are air heating furnaces disposed below the conveyor 81a. Air cooling furnaces 86, 87, 88, and 89 are disposed above the conveyor 81a corresponding to the air heating furnaces 82, 83, 84, and 85. Numerals 90a and 90b are air heating furnaces disposed adjacent to the exit of the air heating furnaces 85. The air heating furnaces 90a and 90b are used for soldering of an input terminal. The furnaces 82–89 have similar configurations. The air heating furnaces 82–84 and the air cooling furnaces 86–88 are placed at right angles to the travel direction of the conveyor 81a and the air heating furnace 85 and the air cooling furnace 89 are placed in the same direction with respect to the travel direction of the conveyor 81a. In each of the air heating furnace 85 and the air cooling furnace 89, the width of the right angle direction is about 70 cm and the length of the same direction is about 1 m. The reflow furnace temperature distribution is as shown in FIG. 17B. That is, in FIG. 17B, vertical axis T is temperature (centigrade) and horizontal axis t is time (seconds). Temperature is raised for preheating an electronic unit at time 91 which the electronic unit passes through the first furnace made up of the air heating furnace 82 and the air cooling furnace 88. Next, the preheating temperature is held at time 92 which the electronic unit passes through the second furnace made up of the air heating furnace 83 and the air cooling furnace 87. Likewise, the preheating temperature is held at time 93 which the electronic unit passes through the third furnace made up of the air heating furnace 84 and the air cooling furnace 88. At time 94 which the electronic unit passes through the fourth furnace made up of the air heating furnace 85 and the air cooling furnace 89, the temperature on the side of a printed-circuit board (not shown) where chip parts are placed is set to high temperature, reflow soldering is performed, and deformed parts (an electrolytic capacitor, an IFT transformer, etc.,) easily affected by temperature, placed to the opposite side of the printed-circuit board is fixedly secured by reflow soldering, while cooling by the air cooling furnace 89 for protecting the deformed parts. Further, the frame 71 is fixedly secured by reflow soldering. After this, at time 95, in the air heating furnaces 90a and 90b used for soldering of an input terminal (connector) placed on the frame of the electronic unit, the input terminal is soldered to the frame.

Figure 18:
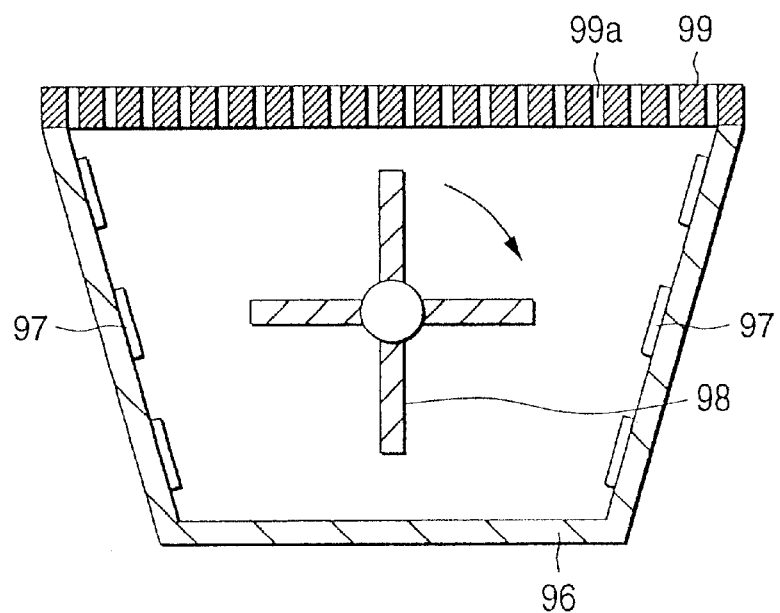
FIG. 18 is a sectional view of an oven forming a part of the second reflow furnace in the embodiment of the invention.

FIG. 18 is a sectional view of the furnace 82–89. In the figure, numeral 96 is an oven opened on one side. The oven 96 has sides widening toward the opening and a heater 97 is disposed on each of the sides. An agitating fan 98 is provided roughly at substantially the center of the oven 96. Numeral 99 is a rectification plate disposed on the opening of the oven 96 and holes 99a are made in the rectification plate 99 like a lattice. Therefore, air heated by the heaters 97 is agitated by the fan 98 and is passed through the holes 99a of the rectification plate 99, then becomes hot air rectified in one direction. The hot air temperature is controlled by the heaters 97. The air cooling furnaces differ from the air heating furnaces only in control temperature and are similar to the air heating furnaces.

Figure 19:
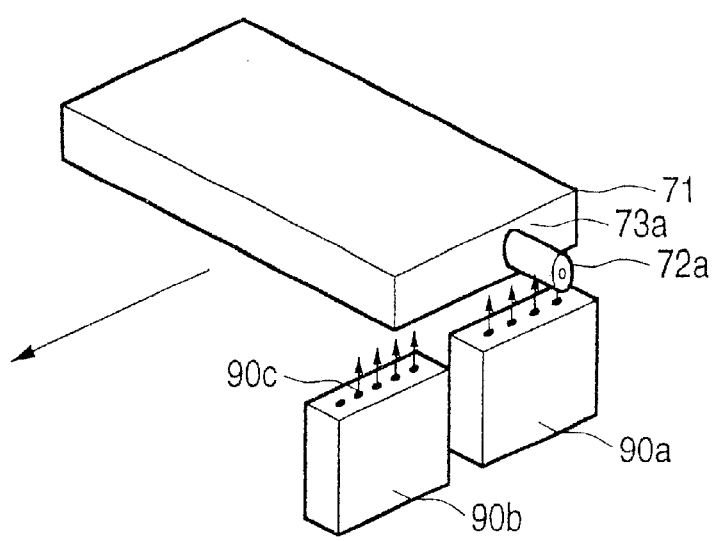
FIG. 19 is a perspective view of the neighborhood of air heating furnaces dedicated to soldering of an input terminal connector in the second reflow furnace in the embodiment of the invention.

FIG. 19 shows the air heating furnaces 90a and 90b for fusing and fixedly securing cream solder 73a applied to the root of an input terminal 72a placed on a frame 71 of an electronic unit. Hot air ranging from 230 to 260 degrees is jetted from linearly arranged holes 90c of the air heating furnaces 90a and 90b.

Figure 20:
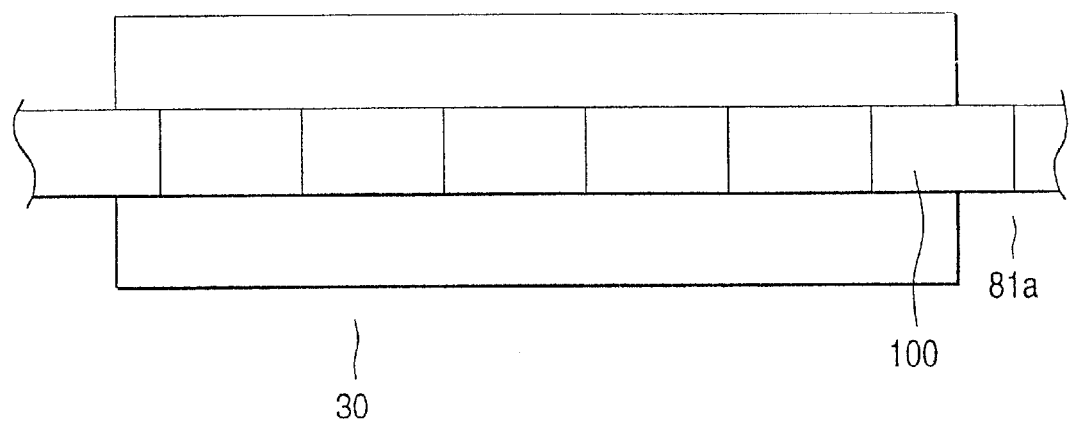
FIG. 20 is a plan view of the neighborhood of a conveyor in the second reflow furnace in the embodiment of the invention.

FIG. 20 is a plan view of the neighborhood of the conveyor 81a in the reflow furnace 30 according to the first example. Numeral 100 is a pallet transported on the conveyor 81a. The pallets 100 flow continuously in the reflow furnace 30 as shown in FIG. 20. Therefore, the air heating furnaces 82–85 and the air cooling furnaces 86–89 are separated by the pallets 100, so that they can be controlled in temperature separately and temperature setting is facilitated.

Figure 21:
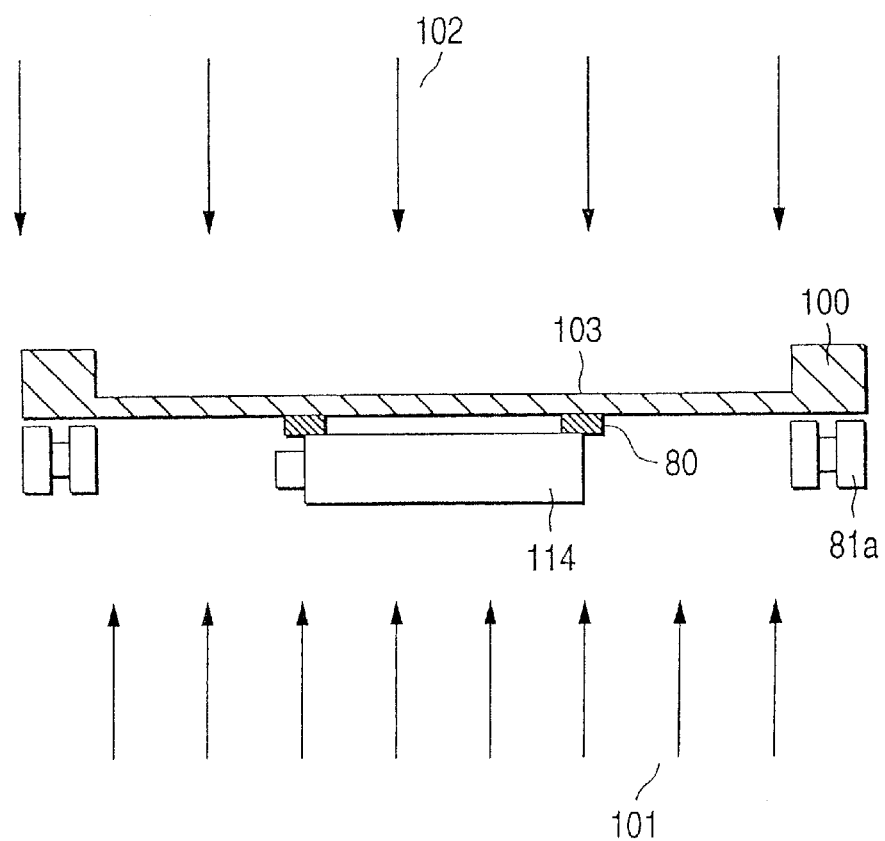
FIG. 21 is a sectional view of the neighborhood of the conveyor in the second reflow furnace in the embodiment of the invention.

FIG. 21 is a sectional view of the neighborhood of the pallet 100 in the reflow furnace 30. In the figure, numeral 81a is the conveyor. The pallet 100 is placed on the conveyor 81a and is transported. It has a bottom 103 forming a mask pallet in which holes are made, as described later. Numeral 114 is an electronic unit attracted detachably to the mask pallet 103 by a magnet 80. Numeral 101 is hot air and numeral 102 is cold air. The hot air 101 and the cold air 102 are separated by the mask pallet 103, as shown in FIG. 5, so that temperature control on the sides of the printed-circuit board 32 at the reflow time can be easily performed.

Figure 22:
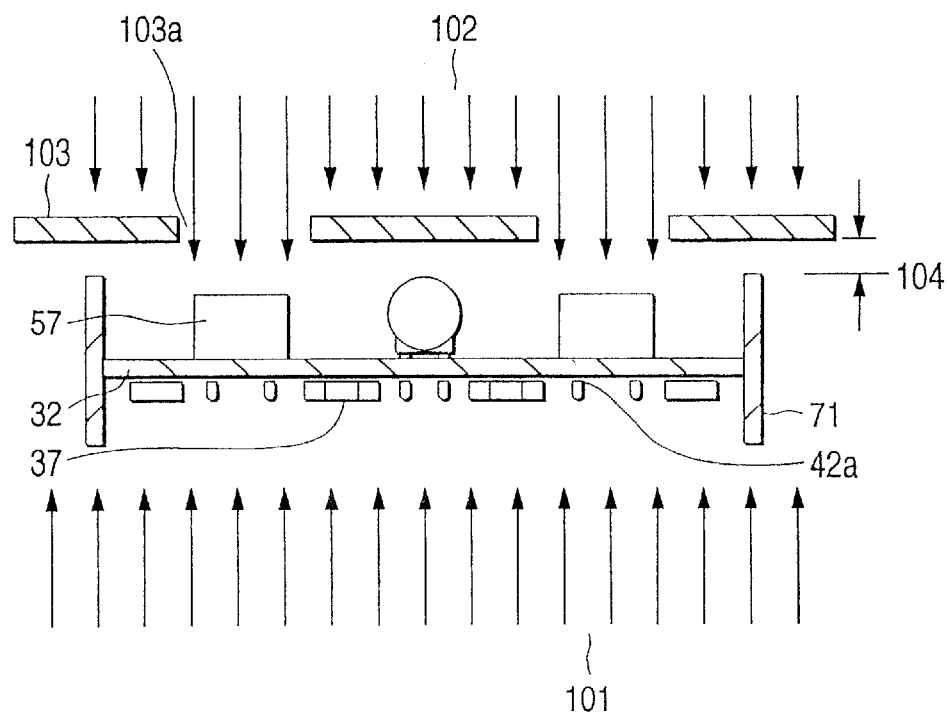
FIG. 22 is a sectional view of the main part of the second reflow furnace in the embodiment of the invention.

FIG. 22 is a sectional view of the main part of the reflow furnace 30. In the figure, numeral 71 is the frame of the electronic unit and numeral 32 is a printed-circuit board placed in the frame 71. Chip parts 37 and deformed parts (a coil, an IFT transformer, a Mylar capacitor, lead wires, etc.,) are placed on the printed-circuit board 32. The hot air 101 at temperature 420–450 degrees is jetted to one side of the printed-circuit board 32 where the chip parts 37 are placed and cold air 102 at about 90 degrees is jetted onto the opposite side of the printed-circuit board 32 where the deformed parts are placed. Numeral 103 is the mask pallet for shutting off the cold air 102. The mask pallet 103 is made of stainless steel having about 1 mm thickness. The mask pallet 103 may be made of heat-resistant material which is not oxidized. Numeral 103a is a hole made in the mask pallet 103. The cold air 102 is passed through the holes 103a for cooling the deformed parts, such as an electrolytic capacitor and an IFT transformer, easily affected by intense heat, whereby even parts easily affected by intense heat can be reflow-soldered with good quality. Above deformed parts having high thermal conductivity (a coil, lead wires, a Mylar capacitor, etc.,), the metal frame 71, and a metal partition plate 71c, inflow of the cold water is shut off by the mask pallet 103, because if the cold air 102 is applied to the parts having high thermal conductivity, the side of the printed-circuit board 32 where the chip parts 37 are placed is also cooled due to the high thermal conductivity, so that good soldering cannot be executed. It is important to make a gap (about 3 mm) between the frame 71 and the mask pallet 103 so that the mask pallet 103 does not take heat of the frame 71 or the partition plate 71c. Temperature change on the chip part 37 placement side of the printed-circuit board 32 on the hot air 101 side is similar to that shown in FIG. 4B. That is, in FIG. 4B, vertical axis T is temperature (centigrade) and horizontal axis t is time (seconds). First, temperature T1 for about 90 seconds between t1 and t2 is held 100–160 degrees and temperature T2 for about 20 seconds between t3 and t5 is held 200 degrees or more. At this time, the highest temperature T3 is 220–240 degrees. The deformed parts are fixedly secured strongly to the printed-circuit board 32 with cream solder 42a by performing such temperature control. In addition, the frame 71 is fixedly secured strongly to the printed-circuit board 32 with cream solder applied by the cream solder application machine 27. The chip parts 37 remain fixedly secured strongly to the printed-circuit board 32 and do not peel off therefrom owing to the surface tension of the cream solder 42a. Thus, the deformed parts easily affected by intense heat can be protected reliably and the soldering quality of the chip part 37 side of the printed-circuit board 32 can be held good.

Figure 23:
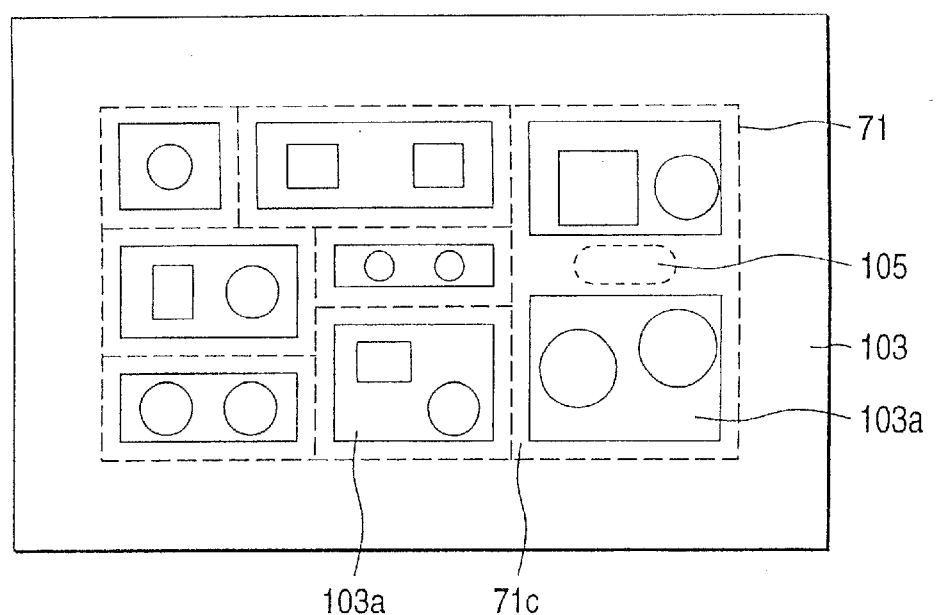
FIG. 23 is a plan view of a mask pallet in the second reflow furnace in the embodiment of the invention.

FIG. 23 is a plan view of the mask pallet 103. Numeral 71 is the frame 71, as indicated by the dash line and numeral 71c is the partition plate. Numeral 103a is the hole for sending cold air to deformed parts easily affected by intense heat. Numeral 105 is a part having high thermal conductivity, such as a Mylar capacitor. Thus, the mask pallet 103 protects deformed parts easily affected by intense heat from reflow heat and shuts off applying cold air to parts having high thermal conductivity for maintaining good soldering quality.

Figure 24:
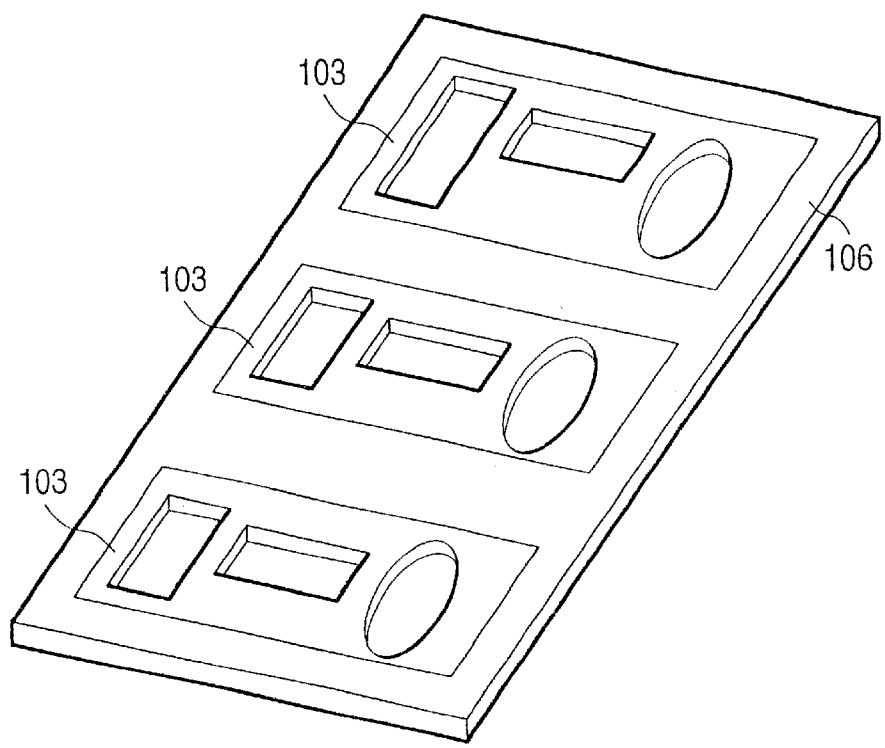
FIG. 24 is a perspective view of a heat shielding plate formed with mask pallets in the second reflow furnace in the embodiment of the invention.

FIG. 24 shows one cold air shielding plate 106 formed with three mask pallets 103. A plurality of mask pallets 103 are thus formed on one cold air shielding plate 106, whereby productivity can be improved.

Figure 25:
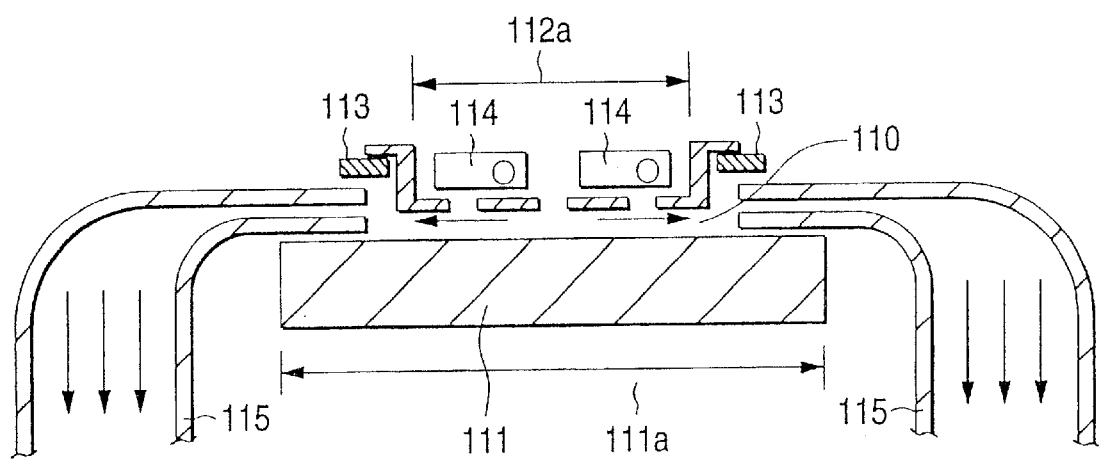
FIG. 25 is a sectional view of the main part of a thermal furnace forming a part of a reflow furnace according to a second example of the second reflow furnace in the embodiment of the invention.

FIG. 25 is a sectional view of the main part according to a second example of a furnace forming a part of the reflow furnace 30. In the figure, numeral 111 is an infrared heater. A mask pallet 112 is placed via a gap 110 about 2 mm above the infrared heater 111 so that the mask pallet 112 can be transported on a conveyor 113. Electronic units 114 are placed in the mask pallet 112. The electronic units 114 are the same as those described in the first example.

Heat absorption ducts 115 extend from both ends of the gap between the infrared heater 111 and the mask pallet 112 for absorbing heat from the infrared heater 111 to control temperature in the furnace. The heat absorption ducts 115 can be thus used to control the temperature in the furnace for protecting deformed parts of non-heat-resistant parts. In the embodiment according to the second example, the need for air cooling furnaces is eliminated and cost reduction is enabled. The infrared heater 111 has a width 111a of about 480 mm and the mask pallet 112 has a width 112a of about 280 mm. Since the width 111a of the infrared heater 111 is about twice the width 112a of the-mask pallet 112, uniform heat can be applied to the mask pallet 112.

Figure 26:
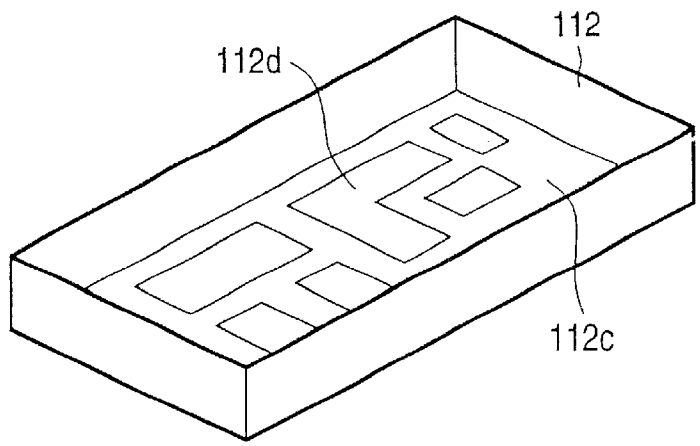
FIG. 26 is a perspective view of a pallet according to the second example of the second reflow furnace in the embodiment of the invention.

FIG. 26 is a perspective view of the mask pallet 112. As shown here, a plurality of holes 112d are made in a bottom 112c of the mask pallet 112. The holes 112d are made corresponding to the positions of heat-resistant parts on a printed-circuit board 32, facilitating fusing of cream solder on the heat-resistant parts. That is, the side of the printed-circuit board 32 corresponding to the holes 112d becomes higher temperature than the opposite side, so that temperature difference control between heat-resistant and non-heat-resistant parts is furthermore facilitated. Here, chip parts as face-mounted parts are classified into heat-resistant parts, an electrolytic capacitor, an IFT transformer, and the like of deformed parts are classified into non-heat-resistant parts, and a Mylar capacitor, a coil, and the like are classified into high-thermal-conductivity parts.

Figure 27:
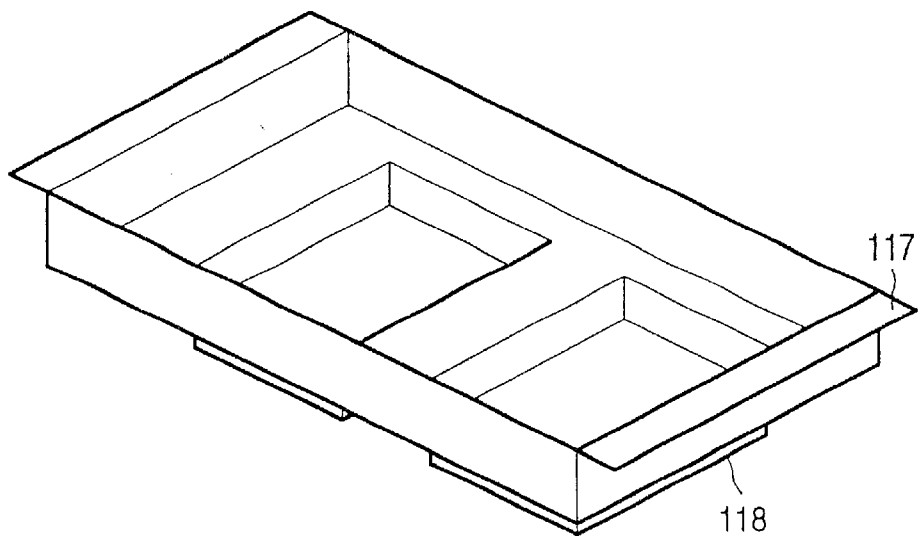
FIG. 27 is a perspective view of another example of a pallet according to the second example of the second reflow furnace in the embodiment of the invention.
Figure 28:
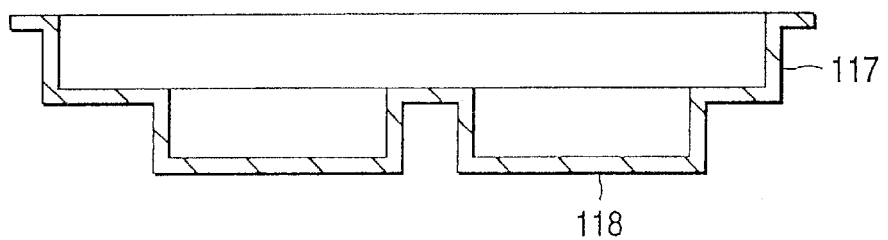
FIG. 28 is a sectional view of the pallet in FIG. 27 according to the second example of the second reflow furnace in the embodiment of the invention.

FIG. 27 is a perspective view of another example of a pallet. FIG. 28 is a sectional view of the pallet in FIG. 27. In the example shown in the figures, two concave parts 118 are furthermore formed in the bottom of the pallet 117 and holes through which hot air passes are made in the bottoms of the concave parts 118, forming a mask pallet. The two concave parts 118 are made for reflow-soldering two electronic units 114 at a time. The pallet 117 uses a stainless material having 1.0 mm thickness. If the thickness is less than 1.0 mm, the pallet strength cannot be maintained. However, with the stainless material 1.0 mm thick, reflow heat is taken and good soldering cannot be executed, thus a stainless material 0.5 mm thick is used for the concave part 118 to lessen the taken heat quantity for enabling good soldering.

Figure 29A:
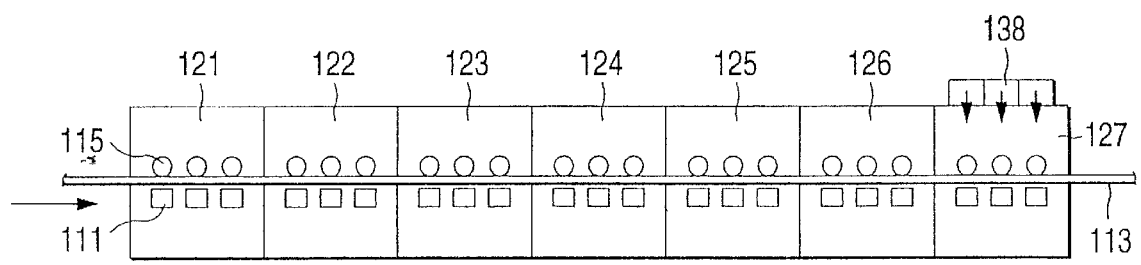
FIG. 29A is a side view of a reflow furnace according to the second example of the second reflow furnace in the embodiment of the invention.
Figure 29B:
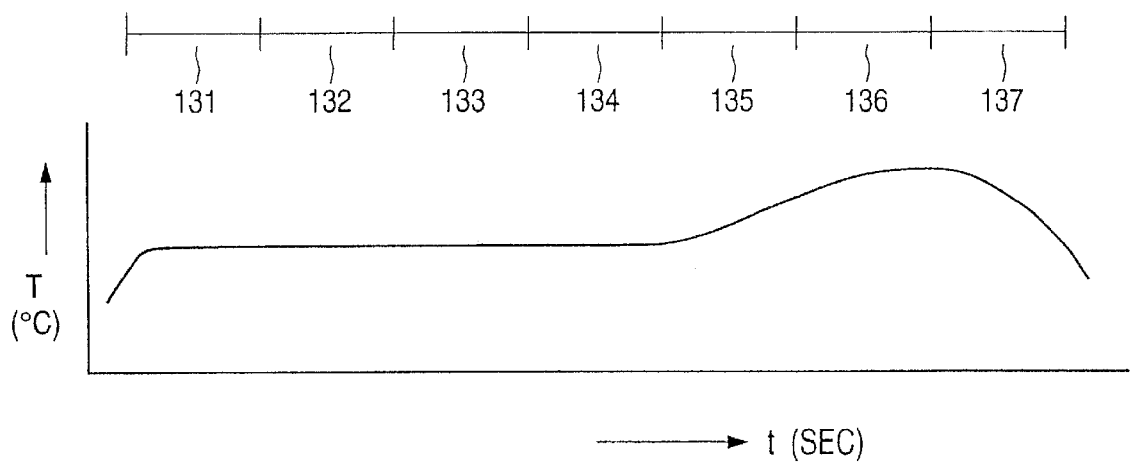
FIG. 29B is a temperature distribution chart in the reflow furnace in the embodiment of the invention.

FIG. 29A is a side view of a reflow furnace in another example of the reflow furnace 30 and FIG. 29B is a temperature distribution chart in the reflow furnace. In FIG. 29A, numerals 121–127 are the thermal furnaces making up the reflow furnace previously described with reference to FIG. 25; the seven thermal furnaces 121–127 are connected in series for making up the reflow furnace 30. Numeral 113 is a conveyor as transport means on which an electronic unit (not shown) placed on a pallet (not shown) is transported. Numeral 111 is a heater. Three heaters 111 are installed in one thermal furnace 121. Numeral 115 is a duct. The ducts 115 are placed facing the heaters 111 with the conveyor 113 between them.

The whole length of the reflow furnace is about 6500 mm and the speed of the conveyor 113 is about 1.4 mm per minute. The reflow furnace temperature distribution is as shown in FIG. 29B. That is, in FIG. 29B, vertical axis T is temperature (centigrade) and horizontal axis t is time (seconds). Temperature is raised for preheating an electronic unit 114 at time 131 which the electronic unit passe through the thermal furnace 121. Next, the preheating temperature is held at time 132 to time 134 which the electronic unit passes through the thermal furnaces 122–124. At time 135 to time 136 at which the electronic unit passes through the thermal furnaces 125 and 126, the temperature on the side of a printed-circuit board (not shown) where chip parts are placed is set to high temperature and reflow soldering is performed. At this time, although deformed parts (an elec-trolytic capacitor, an IFT transformer, etc.,) and the frame 71 are also fixedly secured by reflow soldering, the temperature in the thermal furnaces is maintained so that the performance of deformed parts easily affected by temperature, placed on the opposite side of the printed-circuit board is maintained, protecting the deformed parts. Then, at time 137, in the thermal furnace 127 dedicated to soldering of an input terminal (connector) placed on the frame of the electronic unit, the input terminal is soldered to the frame. Numeral 138 is a cooling fan for cooling the electronic unit flowing out from the reflow furnace.

Figure 30:
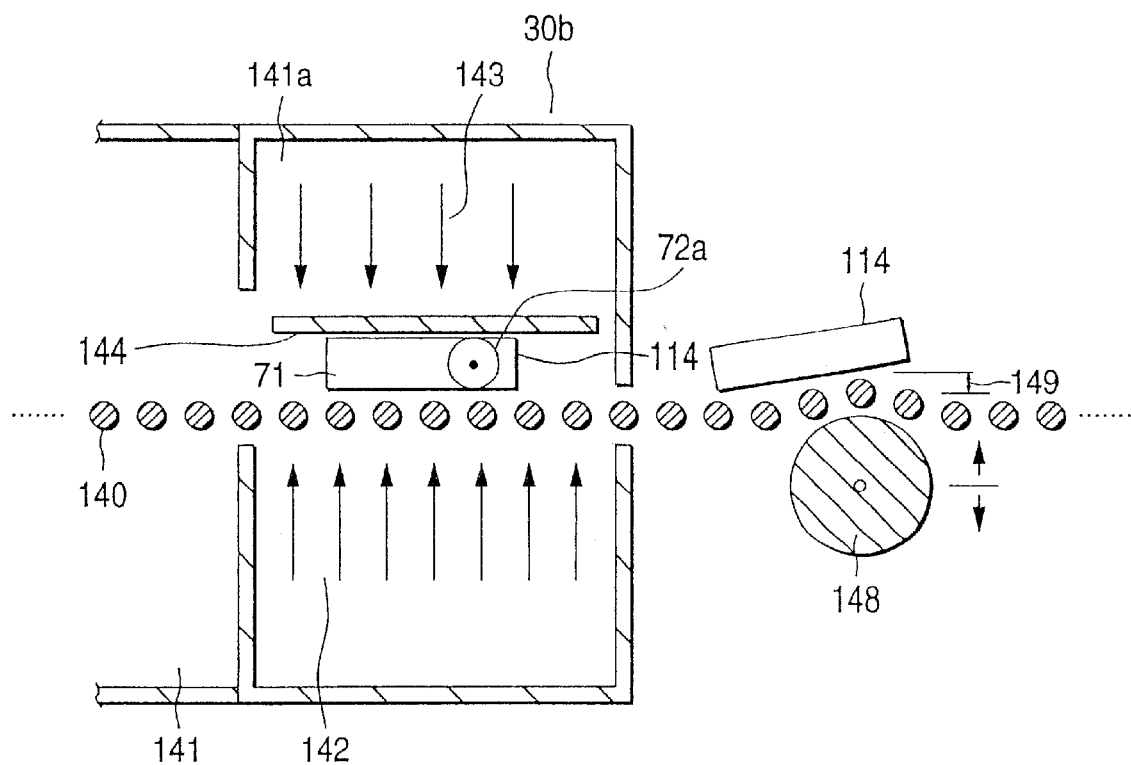
FIG. 30 is a sectional view of the main part of a reflow furnace according to a third example of the second reflow furnace in the embodiment of the invention.

FIG. 30 is a sectional view of the main part of a reflow furnace 30b in a third example of the reflow furnace 30. In the figure, numeral 140 is a net conveyor provided piercing the reflow furnace 30b. An electronic unit 114 is placed on the net conveyor 140 and is transported. The reflow furnace 30b is separated into a plurality of furnaces 141. In the furnaces 141, temperature is raised for preheating an electronic unit 114 from 100 degrees to 160 degrees in accordance with the flow of the net conveyor 140 and subsequently the preheating temperature is held for about 90 seconds, as described above. In the last furnace 141a, the electronic unit 114 is heated to 200 degrees or more for about 20 seconds and is reflow-soldered. Numeral 142 is hot air circulated by convection from the bottom of the furnace 141a to the net conveyor 140 and numeral 143 is cold air circulated by convection from the top of the furnace 141a to the net conveyor 140.

The hot air 142 and cold air 143 are thus circulated by convection, whereby they are separated in the proximity of the net conveyor 140. Therefore, the need for a pallet for separating the hot air 142 and cold air 143 is eliminated.

Numeral 144 is a shielding plate for shielding the cold air 143 from direct contact with an input terminal 72 (used as an example of a connection terminal) placed on a frame 71 of the electronic unit 114. The shielding plate 144 is provided only in the furnace 141a at the last position of the reflow furnace 30b so that heat of the input terminal 72 of an F-shaped connector having a large heat capacity is not taken due to the cold water 143. Thus, the input terminal 72 is reflow-soldered to the frame 71 by heat of the hot air 142.

Figure 31:
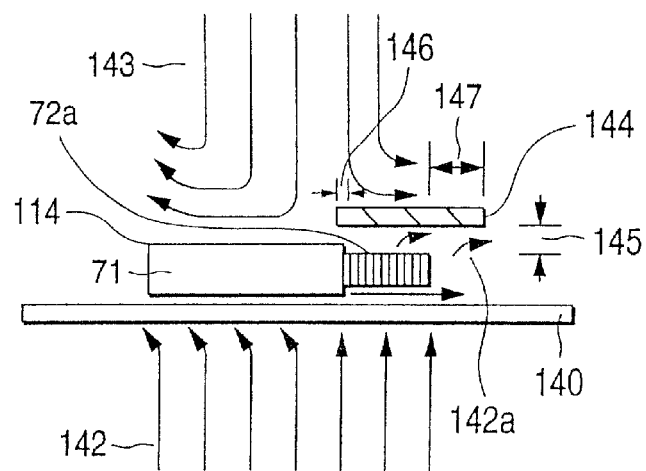
FIG. 31 is a sectional view of the main part of the reflow furnace from a different aspect in the embodiment of the invention.
Figure 32:
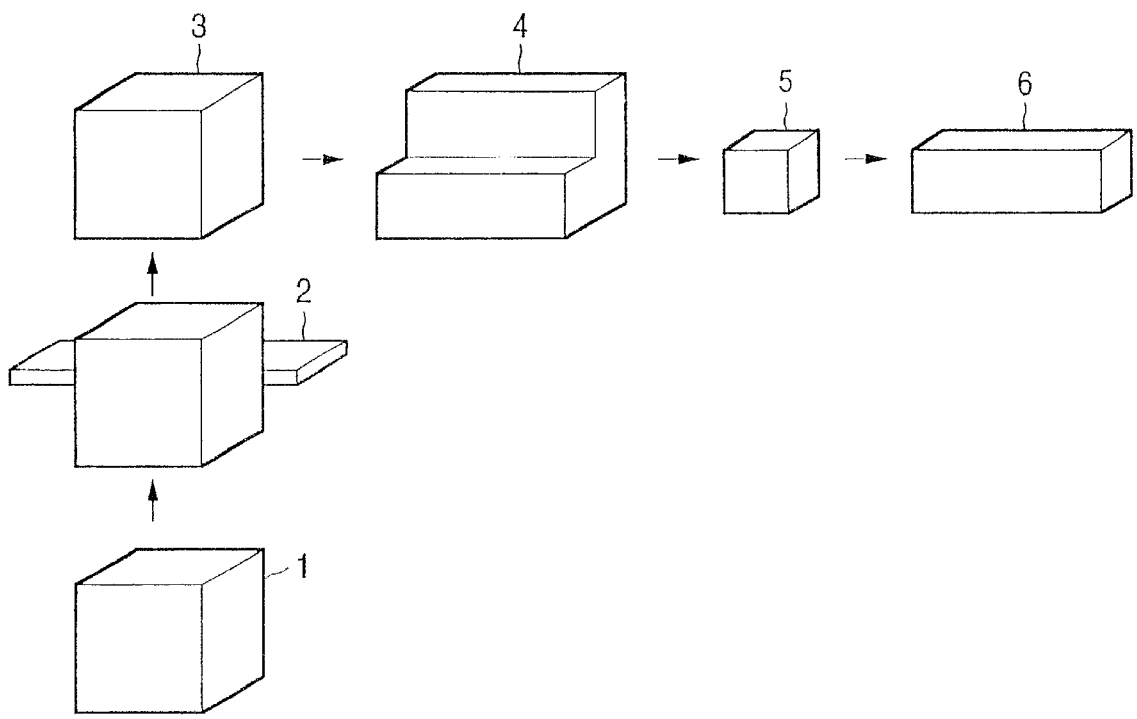
FIG. 32 is a schematic representation of a conventional electronic unit manufacturing apparatus.
Figure 33:
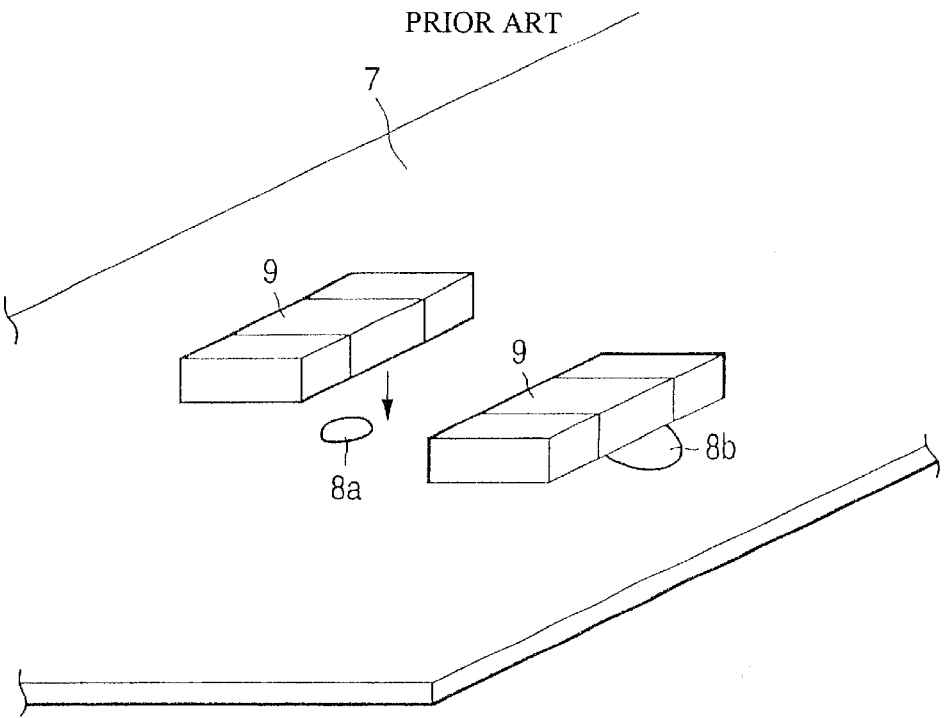
FIG. 33 is a perspective view of the main part of an adhesive printer in the conventional electronic unit manufacturing apparatus.
Figure 34:
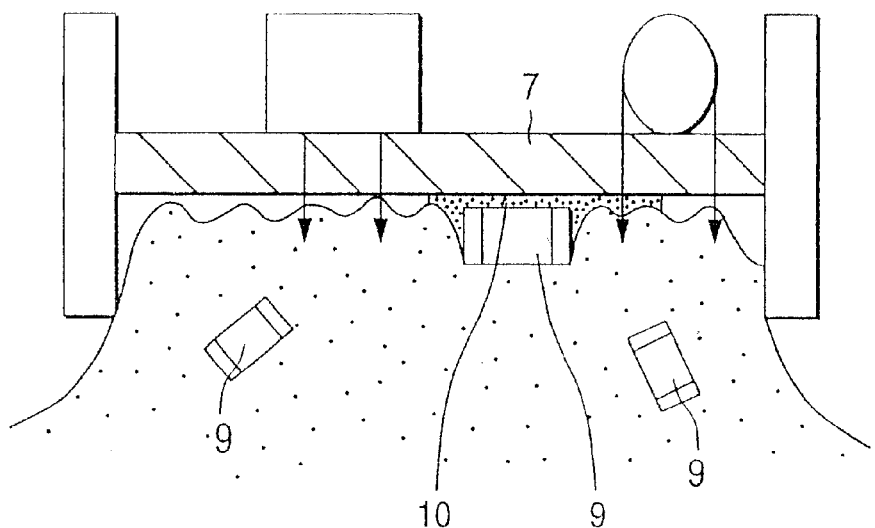
FIG. 34 is a sectional view of the main part of a solder dip oven in a first state thereof in the conventional electronic unit manufacturing apparatus.
Figure 35:
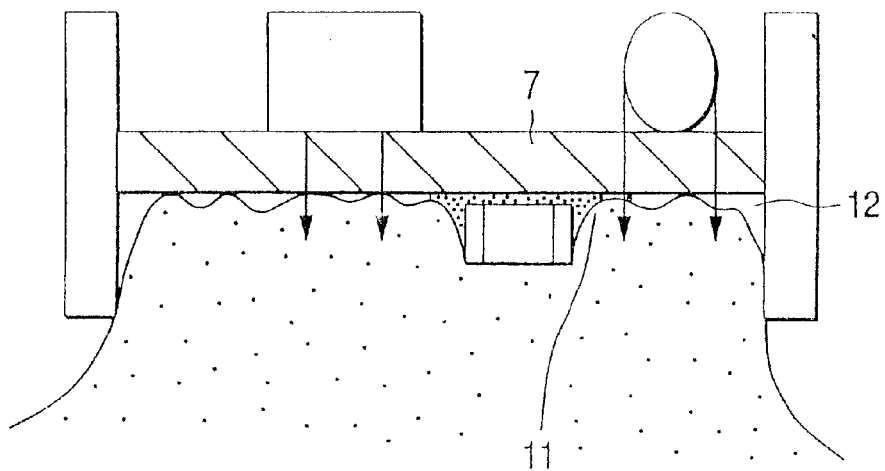
FIG. 35 is a sectional view of the main part of the solder dip oven in a second state thereof in the conventional electronic unit manufacturing apparatus.

FIG. 31 is a sectional view of the furnace 141a from a different direction. The shielding plate 144 is formed of a stainless material having 2–3 mm thickness so that it is not rusted if the shielding plate 144 is placed in the hot air 142. The shielding plate 144 is disposed at a position about 3 mm apart from the top of the electronic unit 114. As this dimension 145, about 3–15 mm is proper. The shielding plate 144 enters about 2 mm toward a frame 71 side 146 of the input terminal 72a and projects about 30 mm to a tip side 147 of the input terminal 72a. The shielding plate 144 is thus disposed, whereby the hot air 142 flows around the input terminal 72a as indicated by 142a and the input terminal 72a is reflow-soldered.

In FIG. 30, numeral 148 is a roller disposed below the net conveyor 140 at an exit of the reflow furnace 30b. The roller 148 is adapted to lift up the net conveyor 140 by a minute distance 149 to peel off the electronic unit 114 stuck on the net conveyor 140 therefrom. The roller 148 is disposed so that it can be adjusted 5–10 mm up and down by screw tightening.

Thus, the electronic unit soldering apparatus is constructed by the net conveyor 140 for transporting the electronic unit 114 and a reflow furnace 30b through which the net conveyor 140 on which the electronic unit 114 is placed passes with the cold air 143 circulated by convection above the net conveyor 140 and the hot air 142 circulated by convection below the net conveyor 140. The reflow furnace 30b is provided with the shielding plate 144 for shutting off the cold air 143 above the input terminal 72a disposed in the frame 71 of the electronic unit 114. Therefore, the temperature on the non-heat-resistant part side is cooled by the cold air 143, thus the non-heat-resistant parts are protected and reflow soldering can be executed; the soldering quality becomes good and correction work is drastically reduced.

The hot air 142 and the cold air 143 are circulated by convection, thereby eliminating the need for a pallet; the electronic unit 114 is placed directly on the conveyor 140 as transport means and an improvement in workability and cost reduction are enabled.

Further, the shielding plate 144 enables the input terminal 72 of the electronic unit 114 to be soldered in the reflow furnace 30b.

The electronic unit 114 is separated from the net conveyor 140 by the roller 148. Thus, even if the electronic unit 114 is stuck on the net conveyor 140 with paste, etc., adhering to the net conveyor 140, it is separated and workability is improved.

Further, the separation degree of the electronic unit 114 from the net conveyor 140 by the roller 148 can be adjusted to an optimum value in response to the size of the electronic unit 114.

[Advantages of the Invention]

According to the invention, there is provided an electronic unit manufacturing apparatus including a cream solder printer for printing cream solder on one side of a printed-circuit board, a chip placement machine for placing a plane-mounted part on the printed-circuit board on which the cream solder is printed, a first reflow furnace for fixedly securing the plane-mounted part to the printed-circuit board, a solder application machine for applying a larger amount of cream solder than that printed by the cream solder printer to the surroundings of holes made in the one side of the printed-circuit board, and a second reflow furnace for inserting pins of a deformed part into the holes made in the printed-circuit board from an opposite side thereof and fixedly securing the pins of the deformed part to the printed-circuit board, wherein in the second reflow furnace, temperature on the opposite side of the printed-circuit board is set lower than temperature on the one side thereof. Cream solder is printed on or applied to the plane-mounted parts and the deformed parts, then are fixedly secured to the printed-circuit board in the reflow furnaces. Thus, defects of an unsoldered portion, a solder bridge, etc., are extremely reduced. Resultantly, correction work in the later process is very lessened.

Since the plane-mounted parts are first fixedly secured to the printed-circuit board in the first reflow furnace, they do not drop from the printed-circuit board in the manufacturing step. Therefore, the correction work in the later process also lessens in this point.

Further, in the second reflow furnace, the temperature on the opposite side of the printed-circuit board is set lower than the temperature on the one side thereof. Thus, destroying of the deformed parts placed on the opposite side of the printed-circuit board due to reflow heat is prevented.

Since the plane-mounted parts are fixedly secured to the one side of the printed-circuit board and the deformed parts are placed on the opposite side thereof, the electronic unit can be miniaturized.

Further, in the above electronic unit manufacturing apparatus, the cream solder printer includes a base on which a printed-circuit board is placed, a screen disposed above the base, cream solder poured onto the screen, and a squeegee for sliding over the screen for transferring the cream solder to the printed-circuit board through holes made in the screen, wherein a small gap is provided between the screen and the printed-circuit board and the squeegee is pressed against the base and slides. Since a small gap is provided between the screen and the printed-circuit board and the squeegee is pressed against the base and slides, the cream solder can be transferred reliably to the printed-circuit board and the solder once printed thereon does not return to the screen.

In addition, in the above electronic unit manufacturing apparatus, the solder application machine includes a tank being filled with cream solder and opened on a top, two squeegees being disposed above the tank so that they can move in a horizontal direction toward and away from each other, an imprint plate being inserted into and drawn out from the tank through the two squeegees, and a push pin, after the imprint plate drawn out from the tank is placed away from the printed-circuit board in parallel therewith, for piercing a hole made in the imprint plate and filled with cream solder for applying the cream solder onto the printed-circuit board. Since the amount of the cream solder applied to the printed-circuit board is determined by the hole capacity of the imprint plate, the cream solder application amount always becomes constant with no variations, so that good soldering quality is provided.

In addition, the lower face of the squeegee is inclined about 45 degrees downward with respect to the imprint plate. By adopting this angle, a constant amount of cream solder can be reliably filled into the hole made in the imprint plate and the cream solder deposited on the surface or rear face of the imprint plate can be restored to the tank.

Further, the spacing between the printed-circuit board and the imprint plate is made larger than the packaging thickness of the plane-mounted part. Thus, a constant amount of cream solder can be reliably applied to the printed-circuit board although the plane-mounted parts are placed thereon. If there is an area allowing the push pin to be entered, the packaging density of the plane-mounted parts can be raised and the electronic unit can be miniaturized.

Moreover, the solder application machine further includes a vessel filled with alcohol, wherein the push pin is inserted into the vessel and the alcohol is deposited on the tip of the push pin, then the push pin is inserted into the hole made in the imprint plate. Since the alcohol is deposited on the tip of the push pin, when cream solder is applied to the printed-circuit board, the push pin and the cream solder are well separated.

In addition, in the above electronic unit manufacturing apparatus, the second reflow furnace includes an air heating furnace for heating the side of the plane-mounted part placed on the one side of the printed-circuit board and an air cooling furnace for cooling the side of the deformed part placed on the opposite side of the printed-circuit board. Since the second reflow furnace has independent air heating and cooling furnaces, temperature control is facilitated. The deformed parts are placed on the opposite side to the plane-mounted parts with the printed circuit board between and further are cooled in the air cooling furnace. Thus, even deformed parts easily affected by intense heat are free of part performance degradation caused by intense heat.

Further, a mask pallet is provided between the deformed part insertion side of the printed-circuit board and the air cooling furnace and is formed with a hole through which cold air passes at the position corresponding to the placement position of the deformed part low in high-temperature allowance. Only the deformed parts low in high-temperature allowance are cooled by cold air for protection and other portions are less affected by cold air because the mask pallet exists. Thus, deformed parts easily affected by high temperature are reliably protected and good soldering quality is provided.

In addition, the mask pallet is disposed above the deformed part having large heat conductivity so as to block cold air. Since the mask pallet for blocking cold air is disposed above the parts having large heat conductivity, cooling of the face-mounted part side of the printed-circuit board via the parts having large heat conductivity is prevented and the soldering quality of the face-mounted part side can be held good.

Moreover, one cold air shielding plate is formed with mask pallets for several electronic units. A number of electronic units can be soldered at a time.

In addition, in the electronic unit manufacturing apparatus, hot air is set to 420 to 450 degrees and cold air is set to about 90 degrees. The temperatures are thus set, whereby the deformed parts easily affected by intense heat are protected reliably and the soldering quality of the face-mounted part side of the printed-circuit board can be held good.

Further, in the electronic unit manufacturing apparatus, the mask pallets are transported continuously in the second reflow furnace. Since the air heating and cooling furnaces are separated by the mask pallets, separate temperature control of the air heating and cooling furnaces is facilitated.

In the electronic unit manufacturing apparatus, the second reflow furnace includes a heater disposed below a pallet and a heat absorption duct for absorbing hot air of a gap formed between the pallet and the heater. Because of one furnace, miniaturization and cost reduction are enabled.

In addition, in the above electronic unit manufacturing apparatus, holes are made in the bottom of the pallet at the positions corresponding to the heat-resistant parts mounted on the rear face of the printed-circuit board. The heat-resistant parts can be reliably fused and unnecessary heat is not applied to other portions, thus protection of the non-heat-resistant parts is facilitated.

Moreover, in the above electronic unit manufacturing apparatus, a concave part is formed in the bottom of the pallet, holes are made in the bottom of the concave part at the positions corresponding to the heat-resistant parts mounted on the rear face of the printed-circuit board, and the thickness of the material forming the concave part is set to roughly a half of the thickness of the material forming the pallet. The pallet strength is maintained and the concave part does not take reflow heat; good reflow soldering can be executed.

Further, in the electronic unit manufacturing apparatus, the width of the heater is made roughly twice the width of the pallet. Since uniform heater heat is applied to the pallet, good soldering quality is provided.

In addition, in the above electronic unit manufacturing apparatus, in the second reflow furnace, the rear face of the printed-circuit board is preheated from 100 to 160 degrees for about 90 seconds, then is heated to 200 degrees or more for about 20 seconds. The surface temperature of the printed-circuit board is thus set, whereby the non-heat-resistant parts are protected reliably and the soldering quality of the heat-resistant part side of the printed-circuit board can be held good.

Moreover, in the above electronic unit manufacturing apparatus, in the second reflow furnace, after the rear face of the printed-circuit board is heated to 200 degrees or more, only the root of the input terminal mounted on the frame of the electronic unit is heated by hot air ranging from 230 to 260 degrees. The input terminal mounted on the frame can be soldered in the same process.

In addition, the second reflow furnace may includes a net conveyor for transporting an electronic unit and a reflow furnace through which the net conveyor on which the electronic unit is placed passes with cold air circulated by convection above the net conveyor and hot air circulated by convection below the net conveyor, the reflow furnace being provided with a shielding plate for shutting off the cold air above an input terminal disposed in a frame of the electronic unit. Since the non-heat-resistant part side is cooled by cold air, the non-heat-resistant parts are protected and reflow soldering can be executed; good soldering quality is provided for drastically lessening correction work.

The hot air and the cold air are circulated by convection, thereby eliminating the need for the pallet; the electronic unit is placed directly on the conveyor of transport means and an improvement in workability and cost reduction are enabled.

Further, the shielding plate enables the connection terminal of the electronic unit to be reflow-soldered in the reflow furnace.

In addition, the above electronic unit manufacturing apparatus further includes separation means for separating the net conveyor and the electronic unit. Even if the electronic unit is stuck on the net conveyor with paste, etc., adhering to the electronic unit, it is separated by the separation means and workability is improved.

Further, the separation degree of the separation means can be adjusted. The separation degree can be adjusted to an optimum value in response to the size of the electronic unit.

According to an another aspect of the invention, there is provided an electronic unit manufacturing apparatus including a cream solder printer for printing cream solder on one side of a printed-circuit board, a chip placement machine for placing a plane-mounted part on the printed-circuit board on which the cream solder is printed, a first reflow furnace for fixedly securing the plane-mounted part to the printed-circuit board, a solder application machine for applying a larger amount of cream solder than that printed by the cream solder printer to the surroundings of holes made in the one side of the printed-circuit board, a deformed part insertion machine for inserting pins of a deformed part into the holes made in the printed-circuit board from an opposite side thereof, and a second reflow furnace, after the printed-circuit board into which the deformed part is inserted is placed on a frame, for fixedly securing the printed-circuit board and the deformed part and the printed-circuit board and the frame. Cream solder is printed on or applied to the plane-mounted parts and the deformed parts, then are fixedly secured to the printed-circuit board in the reflow furnaces. Thus, defects of an unsoldered portion, a solder bridge, etc., are extremely reduced. Resultantly, correction work in the later process is very lessened.

Since the plane-mounted parts are first fixedly secured to the printed-circuit board in the first reflow furnace, they do not drop from the printed-circuit board in the manufacturing step. Therefore, the correction work in the later process also lessens in this point.

Further, in the second reflow furnace, the temperature on the opposite side of the printed-circuit board is set lower than the temperature on the one side thereof. Thus, destroying of the deformed parts placed on the opposite side of the printed-circuit board due to reflow heat is prevented.

Since the deformed parts are inserted by the deformed part insertion machine, workability is good.

In addition, the deformed part insertion machine can move two guides in a horizontal direction toward and away from each other for holding a coil of an inserted part, then stops above holes made in the printed-circuit board, next pushes the coil by a pusher so as to insert pins of the coil into the holes made in the printed-circuit board. The elastic coil hard to manually insert can be automatically into the printed-circuit board; workability is improved.

In addition, the deformed part insertion machine can move two guides in a horizontal direction toward and away from each other for holding an IFT transformer of an inserted part, then stops above holes made in the printed-circuit board, next pushes the IFT transformer by a pusher so as to insert pins of the IFT transformer into the holes made in the printed-circuit board. The easy-to-slide IFT transformer hard to manually insert can be automatically into the printed-circuit board; workability is improved.

Moreover, the deformed part insertion machine can include two pairs of holding parts for moving two guides in a horizontal direction toward and away from each other and holds two pins of a Mylar capacitor of an inserted part by means of the two pairs of holding parts, then inserts the two pins of the Mylar capacitor into holes made in the printed-circuit board. The Mylar capacitor having an irregular outer form can also be inserted automatically into the printed-circuit board by holding the pins; workability is improved.

In addition, the deformed part insertion may have a guide having a concave part opened downward and a slider fitted into the concave part via a lead, inserts the lead into a hole made in the printed-circuit board, and draws out the slider, then places the lead on the printed-circuit board. The fine lead hard to hold and manually insert can be inserted automatically into the printed-circuit board; workability is improved.

In addition, in the above electronic unit manufacturing apparatus, the second reflow furnace may include an air heating furnace for heating the side of the plane-mounted part placed on the one side of the printed-circuit board and an air cooling furnace for cooling the side of the deformed part placed on the opposite side of the printed-circuit board. Since the second reflow furnace has independent air heating and cooling furnaces, temperature control is facilitated. The deformed parts are placed on the opposite side to the plane-mounted parts with the printed circuit board between and further are cooled in the air cooling furnace. Thus, even deformed parts easily affected by intense heat are free of part performance degradation caused by intense heat.

Further, a mask pallet may be provided between the deformed part insertion side of the printed-circuit board and the air cooling furnace and is formed with a hole through which cold air passes at the position corresponding to the placement position of the deformed part low in high-temperature allowance. Only the deformed parts low in temperature allowance are cooled by cold air for protection and other portions are less affected by cold air because the mask pallet exists. Thus, deformed parts easily affected by intense heat are reliably protected and good soldering quality is provided.

In addition, the mask pallet may be disposed above the deformed part, the frame on which the printed-circuit board is placed, or a partition plate having large heat conductivity so as to block cold air. Since the mask pallet for blocking cold air is disposed above the parts having large heat conductivity, cooling of the face-mounted part side of the printed-circuit board via the parts having large heat conductivity is prevented and the soldering quality of the face-mounted part side can be held good.

Moreover, a gap about 3 mm can be provided between the upper end of the frame and the mask pallet. The gap prevents the mask pallet from taking heat from the frame of a high-thermal-conductivity part; good soldering is enabled.

In addition, in the above electronic unit manufacturing apparatus, one cold air shielding plate may be formed with mask pallets for several electronic units. A number of electronic units can be soldered at a time.

Further, hot air may be set to 420 to 450 degrees and cold air is set to about 90 degrees. The temperatures are thus set, whereby the deformed parts easily affected by intense heat are protected reliably and the soldering quality of the face-mounted part side of the printed-circuit board can be held good.

In addition, in the above electronic unit manufacturing apparatus, the second reflow furnace may include a net conveyor for transporting an electronic unit and a reflow furnace through which the net conveyor on which the electronic unit is placed passes with cold air circulated by convection above the net conveyor and hot air circulated by convection below the net conveyor, the reflow furnace being provided with a shielding plate for shutting off the cold air above an input terminal disposed in a frame of the electronic unit. Since the non-heat-resistant part side is cooled by cold air, the non-heat-resistant parts are protected and reflow soldering can be executed; good soldering quality is provided for drastically lessening correction work.

The hot air and the cold air are circulated by convection, thereby eliminating the need for the pallet; the electronic unit is placed directly on the conveyor of transport means and an improvement in workability and cost reduction are enabled.

Further, the shielding plate enables the connection terminal of the electronic unit to be reflow-soldered in the reflow furnace.

Moreover, the electronic unit manufacturing apparatus further may include separation means for separating the net conveyor and the electronic unit. Even if the electronic unit is stuck on the net conveyor with paste, etc., adhering to the electronic unit, it is separated by the separation means and workability is improved.

In addition, the separation degree of the separation means can be adjusted. It can be adjusted to an optimum value in response to the size of the electronic unit.

According to an another aspect of the invention, there is provided an electronic unit manufacturing method including a cream solder printing step of printing cream solder on one side of a printed-circuit board, a chip placement step of placing a plane-mounted part on the printed-circuit board on which the cream solder is printed after the cream solder printing step, a first reflow step of fixedly securing the plane-mounted part to the printed-circuit board after the chip placement step, a solder application step of applying a larger amount of cream solder than that printed at the cream solder printing step to the surroundings of holes made in the one side of the printed-circuit board after the first reflow step, and a second reflow furnace for inserting pins of a deformed part into the holes made in the printed-circuit board from an opposite side thereof and then fixedly securing the pins of the deformed part to the printed-circuit board after the solder application step. Cream solder is printed on or applied to the plane-mounted parts and the deformed parts, then are fixedly secured to the printed-circuit board in the reflow furnaces. Thus, defects of an unsoldered portion, a solder bridge, etc., are extremely reduced. Resultantly, correction work in the later process is very lessened.

Since the plane-mounted parts are first fixedly secured to the printed-circuit board at the first reflow step, they do not drop from the printed-circuit board in the manufacturing step following the reflow step. Therefore, the correction work in the later process also lessens in this point.

Further, at the second reflow step, the temperature on the opposite side of the printed-circuit board is set lower than the temperature on the one side thereof. Thus, destroying of the deformed parts placed on the opposite side of the printed-circuit board due to reflow heat is prevented.

In addition, in the above electronic unit manufacturing method, the solder application step may include drawing out an imprint plate from a tank, then placing the imprint plate in parallel with the printed-circuit board and making a push pin pierce through a hole made in the imprint plate and filled with cream solder for applying the cream solder onto the printed-circuit board. Since the amount of the cream solder applied to the printed-circuit board is determined by the hole capacity of the imprint plate, the cream solder application amount always becomes constant with no variations, so that good soldering quality is provided.

Further, alcohol can be deposited on the tip of the push pin, then the push pin is inserted into the hole made in the imprint plate. Since the alcohol is deposited on the tip of the push pin, when cream solder is applied to the printed-circuit board, the push pin and the cream solder are well separated.

In addition, the second reflow step can have an air heating furnace for heating the side of the plane-mounted part placed on the one side of the printed-circuit board and an air cooling furnace for cooling the side of the deformed part placed on the opposite side of the printed-circuit board. Since the second reflow furnace has independent air heating and cooling furnaces, temperature control is facilitated. The deformed parts are placed on the opposite side to the plane-mounted parts with the printed circuit board between and further are cooled in the air cooling furnace. Thus, even deformed parts easily affected by intense heat are free of part performance degradation caused by intense heat.

Moreover, in the above electronic unit manufacturing method, the second reflow step may include a net conveyor for transporting an electronic unit and a reflow furnace through which the net conveyor on which the electronic unit is placed passes with cold air circulated by convection above the net conveyor and hot air circulated by convection below the net conveyor, the reflow furnace being provided with a shielding plate for shutting off the cold air above an input terminal disposed in a frame of the electronic unit. Since the non-heat-resistant part side is cooled by cold air, the non-heat-resistant parts are protected and reflow soldering can be executed; good soldering quality is provided for drastically lessening correction work.

The hot air and the cold air are circulated by convection, thereby eliminating the need for the pallet; the electronic unit is placed directly on the conveyor of transport means and an improvement in workability and cost reduction are enabled.

Further, the shielding plate enables the connection terminal of the electronic unit to be reflow-soldered in the reflow furnace.

According to an another aspect of the invention, there is provided an electronic unit manufacturing method including a cream solder printing step of printing cream solder on one side of a printed-circuit board, a chip placement step of placing a plane-mounted part on the printed-circuit board on which the cream solder is printed after the cream solder printing step, a first reflow step of fixedly securing the plane-mounted part to the printed-circuit board after the chip placement step, a solder application step of applying a larger amount of cream solder than that printed at the cream solder printing step to the surroundings of holes made in the one side of the printed-circuit board after the first reflow step, a deformed part insertion step of inserting pins of a deformed part into the holes made in the printed-circuit board from an opposite side thereof after the solder application step, a frame assembling step of inserting the printed-circuit board into a frame after the deformed part insertion step, a cream solder application step of applying cream solder between the printed-circuit board and the frame after the frame assembling step, a caulking step of caulking the printed-circuit board to the frame after the cream solder application step, and a second reflow step of fixedly securing the frame and the printed-circuit board and the printed-circuit board and the deformed part after the caulking step. Cream solder is printed on or applied to the plane-mounted parts and the deformed parts, then are fixedly secured to the printed-circuit board in the reflow furnaces. Thus, defects of an unsoldered portion, a solder bridge, etc., are extremely reduced. Resultantly, correction work in the later process is very lessened.

Since the plane-mounted parts are first fixedly secured to the printed-circuit board at the first reflow step, they do not drop from the printed-circuit board in the manufacturing step following the reflow step. Therefore, the correction work in the later process also lessens in this point.

Further, at the second reflow step, the temperature on the opposite side of the printed-circuit board is set lower than the temperature on the one side thereof. Thus, destroying of the deformed parts placed on the opposite side of the printed-circuit board due to reflow heat is prevented.

Since the deformed parts are inserted at the deformed part insertion step, workability is good.

What is claimed is:

1. An apparatus for manufacturing an electronic unit from a printed-circuit board having opposing first and second sides and a plurality of holes, said apparatus comprising:

a cream solder printer for printing a first amount of cream solder on the first side of the printed-circuit board;

a chip placement machine operatively associated with said cream solder printer, said chip placement machine having means for placing a plane-mounted part on the printed-circuit board on which the first amount of cream solder is printed;

a first reflow furnace operatively associated with said chip placement machine, said first reflow furnace having means for fixedly securing the plane-mounted part to the printed-circuit board;

a solder application machine operatively associated with said first reflow furnace, said solder application machine having means for applying a second amount of cream solder on the first side of the printed-circuit board after the first amount of cream solder has been printed by said cream solder printer, said solder application machine including an imprint plate with a hole for holding the second amount of cream solder, with said second amount of cream solder being greater than the first amount of cream solder printed by said cream solder printer, said second amount of cream solder held in said hole of said imprint plate being applied in a vicinity of the holes in the printed-circuit board;

a deformed part insertion machine operatively associated with said solder application machine, said deformed part insertion machine having means for inserting pins of a deformed part into the holes of the printed-circuit board from the second side of the printed-circuit board; and a second reflow furnace operatively associated with said deformed part insertion machine, said second reflow furnace having means for reflow soldering the second amount of cream solder, thereby fixedly securing the pins of the deformed part to the printed-circuit board.

2. The apparatus as claimed in claim 1, wherein said cream solder printer comprises:
   a base on which a printed-circuit board is placed;
   a screen disposed above said base and being poured cream solder thereon; and
   a squeegee for sliding over said screen for transferring said cream solder to the printed-circuit board through holes made in said screen;
   wherein a small gap is provided between said screen and the printed-circuit board, and said squeegee is slid while being pressed against said base.

3. The apparatus as claimed in claim 1, wherein said solder application machine comprises:
   a tank being filled with cream solder and opened on a top;
   two squeegees being disposed above said tank so that said two squeegees can move in a horizontal direction toward and away from each other;
   an imprint plate being inserted into and drawn out from said tank through said two squeegees; and
   a push pin for piercing a hole which is made in said imprint plate and is filled with cream solder for applying the cream solder onto the printed-circuit board, after said imprint plate drawn out from said tank is placed away from the printed-circuit board in parallel therewith.

4. The apparatus as claimed in claim 3, wherein a lower face of said squeegee is inclined substantially 45 degrees downward with respect to said imprint plate.

5. The apparatus as claimed in claim 3, wherein a spacing between the printed-circuit board and said imprint plate is made larger than packaging thickness of the plane-mounted part.

6. The apparatus as claimed in claim 3, wherein said solder application machine further includes a vessel filled with alcohol, and further wherein said push pin is inserted into said vessel, the alcohol is deposited on a tip of said push pin, and then said push pin is inserted into the hole made in said imprint plate.

7. The apparatus as claimed in claim 1, wherein said second reflow furnace comprises an air heating furnace for heating a side of the plane-mounted part placed on the one side of the printed-circuit board and an air cooling furnace for cooling a side of the deformed part placed on the opposite side of the printed-circuit board.

8. The apparatus as claimed in claim 7, wherein a mask pallet is provided between the deformed part insertion side of the printed-circuit board and said air cooling furnace and is formed with a hole corresponding to the placement position of the deformed part being low in high-temperature allowance so that cold air is passed through said hole.

9. The apparatus as claimed in claim 8, wherein the mask pallet is disposed above the deformed part having large heat conductivity so as to shield cold air.

10. The apparatus as claimed in claim 8, wherein mask pallets for several electronic units are formed by one cold air shielding plate.

11. The apparatus as claimed in claim 8, wherein hot air is set to 420 to 450 degrees and cold air is set to substantially 90 degrees.

12. The apparatus as claimed in claim 8, wherein the mask pallets are transported continuously in said second reflow furnace.

13. The apparatus as claimed in claim 1, wherein said second reflow furnace comprises:
   a heater disposed below a pallet; and
   a heat absorption duct for absorbing hot air of a gap formed between the pallet and said heater.

14. The apparatus as claimed in claim 13, wherein said pallet has a hole in a bottom thereof corresponding to a heat-resistant part placed on a rear face of the printed-circuit board.

15. The apparatus as claimed in claim 13, wherein said pallet has a concave part in a bottom thereof so as to project toward said heater, the concave part has a hole in a bottom thereof corresponding to a heat-resistant part placed on a rear face of the printed-circuit board, and further wherein thickness of a material forming the concave part is set to substantially a half of thickness of a material forming said pallet.

16. The apparatus as claimed in claim 13, wherein width of said heater is made substantially twice width of the pallet.

17. The apparatus as claimed in claim 13, wherein in said second reflow furnace is for preheating a rear face of the printed-circuit board from 100 to 160 degrees for substantially 90 seconds, and then is heated to 200 degrees or more for substantially 20 seconds.

18. The apparatus as claimed in claim 17, wherein in said second reflow furnace, after heating to 200 degrees or more, only a root of an input terminal placed on a frame of the electronic unit is heated by hot air ranging from 230 to 260 degrees.

19. The apparatus as claimed in claim 1, wherein said second reflow furnace comprises:
   a net conveyor for transporting an electronic unit; and
   a reflow furnace through which said net conveyor having the electronic unit passes with cold air circulated by convection above said net conveyor and hot air circulated by convection below said net conveyor, said reflow furnace having a shielding plate for shutting off the cold air above a connecting terminal disposed in a frame of the electronic unit.

20. The apparatus as claimed in claim 19, further including separation unit for separating said net conveyor and the electronic unit.

21. The apparatus as claimed in claim 20, wherein separation degree of said separation unit can be adjusted.

22. The apparatus according to claim 1, wherein, in the second reflow furnace, the temperature on the second side of the printed-circuit board is set lower than temperature on the first side thereof.

23. An apparatus for manufacturing an electronic unit from a printed-circuit board having opposing first and second sides and a plurality of holes, said apparatus comprising:
   a cream solder printer for printing a first amount of cream solder on the first side of the printed-circuit board;
   a chip placement machine operatively associated with said cream solder printer, said chip placement machine having means for placing a plane-mounted part on the printed-circuit board on which the first amount of cream solder is printed;
   a first reflow furnace operatively associated with said chip placement machine, said first reflow fi&mace having means for fixedly securing the plane-mounted part to the printed-circuit board;
   a solder application machine operatively associated with said first reflow furnace, said solder application machine having means for applying a second amount of cream solder on the first side of the printed-circuit board after the first amount of cream solder has been printed by said cream solder printer, said solder application machine including an imprint plate with a hole for holding the second amount of cream solder, with said second amount of cream solder being larger than the first amount of cream solder printed by said cream solder printer, said second amount of cream solder held in said hole of said imprint plate being applied to surround the holes in the printed-circuit board;

a deformed part insertion machine operatively associated with said solder application machine, said deformed part insertion machine having means for inserting pins of a deformed part into the holes of the printed-circuit board from the second side of the printed-circuit board;

a frame assembling machine operatively associated with said deformed part insertion machine, said frame assembling machine having means for placing a frame on the printed-circuit board with the deformed part;

a second reflow furnace operatively associated with said frame assembling machine, said second reflow furnace having means for fixedly securing the deformed part and the frame to the printed-circuit board.

24. The apparatus as claimed in claim 23, wherein said deformed part insertion machine includes:

two guides being movable in a horizontal direction toward and away from each other for holding a coil as the deformed part, said two guides further being movable for stopping the coil above holes made in the printed-circuit board; and a pusher for pushing the coil placed above said holes so as to insert pins of the coil into said holes.

25. The apparatus as claimed in claim 23, wherein said deformed part insertion machine includes:

two guides being movable in a horizontal direction toward and away from each other so as to hold an IFT transformer as the deformed part, said two guides further being movable so that the IFT transformer is stopped above holes made in the printed-circuit board; and a pusher for pushing the IFT transformer placed above said holes so as to insert pins of the IFT transformer into the holes.

26. The apparatus as claimed in claim 23, wherein said deformed part insertion machine comprises two pairs of holding parts, each of which has two guides being movable in a horizontal direction toward and away from each other and for holding two pins of a Mylar capacitor as the deformed part by means of the two holding part pairs, and said holding parts are for inserting the two pins of the Mylar capacitor into holes made in the printed-circuit board.

27. The apparatus as claimed in claim 23, wherein said deformed part insertion includes a guide having a concave part opened downward, and a slider fitted into the concave part via a lead wire, and further wherein, when the lead wire is to be inserted into holes made in the printed-circuit board, said slider is drawn out, and then the lead wire is to be placed on the printed-circuit board.

28. The apparatus as claimed in claim 23, wherein said second reflow furnace comprises an air heating furnace for heating a side of the plane-mounted part placed on the one side of the printed-circuit board and an air cooling furnace for cooling a side of the deformed part placed on the opposite side of the printed-circuit board.

29. The apparatus as claimed in claim 28, wherein a mask pallet is between the deformed part insertion side of the printed-circuit board and said air cooling furnace and is formed with a hole corresponding to the placement position of the deformed part being low in high-temperature allowance so that cold air is passed through said hole.

30. The apparatus as claimed in claim 29, wherein the mask pallet is disposed above at least one of the deformed part having large heat conductivity, the frame on which the printed-circuit board is placed, and a partition plate, so as to shield cold air.

31. The apparatus as claimed in claim 29, wherein a gap of substantially 3 mm is provided between an upper end of the frame and the mask pallet.

32. The apparatus as claimed in claim 29, wherein mask pallets for several electronic units are formed by one cold air shielding plate.

33. The apparatus as claimed in claim 29, wherein hot air is set to 420 to 450 degrees and cold air is set to substantially 90 degrees.

34. The apparatus as claimed in claim 23, wherein said second reflow furnace comprises:

a net conveyor for transporting an electronic unit; and a reflow furnace through which said net conveyor having the electronic unit passes with cold air circulated by convection above said net conveyor and hot air circulated by convection below said net conveyor, said reflow furnace having a shielding plate for shutting off the cold air above a connecting terminal disposed in a frame of the electronic unit.

35. The electronic unit manufacturing apparatus as claimed in claim 34, further including separation means for separating said net conveyor and the electronic unit.

36. The electronic unit manufacturing apparatus as claimed in claim 35, wherein separation degree of said separation means can be adjusted.

37. An apparatus for manufacturing an electronic unit from a printed-circuit board having opposing first and second sides and a plurality of holes, said apparatus comprising:

a cream solder printer for printing a first amount of cream solder on the first side of the printed-circuit board;

a chip placement machine operatively associated with said cream solder printer, said chip placement machine being adapted to place a plane-mounted part on the printed-circuit board on which the first amount of cream solder is printed;

a first reflow furnace operatively associated with said chip placement machine, said first reflow furnace being adapted to fixedly secure the plane-mounted part to the printed-circuit board;

a solder application machine operatively associated with said first reflow furnace, said solder application machine being adapted to apply a second amount of cream solder on the first side of the printed-circuit board, said second amount of cream solder to be applied in a vicinity of the holes in the printed-circuit board, said solder application machine comprising:

a tank being filled with cream solder and opened on a top;

two squeegees being disposed above said tank so that said two squeegees can move in a horizontal direction toward and away from each other;

an imprint plate being inserted into and drawn out from said tank through said two squeegees; and a push pin for piercing a hole which is made in said imprint plate and is filled with cream solder for applying the cream solder onto the printed-circuit board, after said imprint plate drawn out from said tank is placed away from the printed-circuit board in parallel therewith;

a deformed part insertion machine operatively associated with said solder application machine, said deformed part insertion machine being operable to insert pins of a deformed part into the holes of the printed-circuit board from the second side of the printed-circuit board; and a second reflow furnace operatively associated with said deformed part insertion machine, said second reflow furnace being adapted to reflow solder the second amount of cream solder, thereby fixedly securing the pins of the deformed part to the printed-circuit board.

38. An apparatus for manufacturing an electronic unit from a printed-circuit board having opposing first and second sides and a plurality of holes, said apparatus comprising:

a cream solder printer for printing a first amount of cream solder on the first side of the printed-circuit board;

a chip placement machine operatively associated with said cream solder printer, said chip placement machine being adapted to place a plane-mounted part on the printed-circuit board on which the first amount of cream solder is printed;

a first reflow furnace operatively associated with said chip placement machine, said first reflow furnace being adapted to fixedly secure the plane-mounted part to the printed-circuit board;

a solder application machine operatively associated with said first reflow furnace, said solder application machine being adapted to apply a second amount of cream solder on the first side of the printed-circuit board, said second amount of cream solder to be applied in a vicinity of the holes in the printed-circuit board;

a deformed part insertion machine operatively associated with said solder application machine, said deformed part insertion machine being operable to insert pins of a deformed part into the holes of the printed-circuit board from the second side of the printed-circuit board; and a second reflow furnace operatively associated with said deformed part insertion machine, said second reflow furnace being adapted to reflow solder the second amount of cream solder, thereby fixedly securing the pins of the deformed part to the printed-circuit board, said second reflow furnace comprising:
  a net conveyor for transporting an electronic unit;
  a separation unit for separating said net conveyor and the electronic unit; and
  a reflow furnace through which said net conveyor having the electronic unit passes with cold air circulated by convection above said net conveyor and hot air circulated by convection below said net conveyor, said reflow furnace having a shielding plate for shutting off the cold air above a connecting terminal disposed in a frame of the electronic unit.

39. An apparatus for manufacturing an electronic unit from a printed-circuit board having opposing first and second sides and a plurality of holes, said apparatus comprising:

a cream solder printer for printing a first amount of cream solder on the first side of the printed-circuit board;

a chip placement machine operatively associated with said cream solder printer, said chip placement machine being adapted to place a plane-mounted part on the printed-circuit board on which the first amount of cream solder is printed;

a first reflow furnace operatively associated with said chip placement machine, said first reflow furnace being adapted to fixedly secure the plane-mounted part to the printed-circuit board;

a solder application machine operatively associated with said first reflow furnace, said solder application machine being adapted to supply a second amount of cream solder on the first side of the printed-circuit board, said second amount of cream solder being larger than the first amount of cream solder printed by said cream solder printer, said second amount of cream solder to be applied to surround the holes in the printed-circuit board;

a deformed part insertion machine operatively associated with said solder application machine, said deformed part insertion machine being adapted to insert pins of a deformed part into the holes of the printed-circuit board from the second side of the printed-circuit board;

a frame assembling machine operatively associated with said deformed part insertion machine, said frame assembling machine being adapted to place a frame on the printed-circuit board with the deformed part;

a second reflow furnace operatively associated with said frame assembling machine, said second reflow furnace being adapted to fixedly secure the deformed part and the frame to the printed-circuit board, said second reflow furnace comprising:
  a net conveyor for transporting an electronic unit;
  a separation means for separating said net conveyor and the electronic unit; and
  a reflow furnace through which said net conveyor having the electronic unit passes with cold air circulated by convection above said net conveyor and hot air circulated by convection below said net conveyor, said reflow furnace having a shielding plate for shutting off the cold air above a connecting terminal disposed in a frame of the electronic unit.

40. An apparatus for manufacturing an electronic unit from a printed-circuit board having opposing first and second sides and a plurality of holes, said apparatus comprising:

a cream solder printer for printing a first amount of cream solder on the first side of the printed-circuit board;

a chip placement machine operatively associated with said cream solder printer, said chip placement machine having means for placing a plane-mounted part on the printed-circuit board on which the first amount of cream solder is printed;

a first reflow furnace operatively associated with said chip placement machine, said first reflow furnace having means for fixedly securing the plane-mounted part to the printed-circuit board;

a solder application machine operatively associated with said first reflow furnace, said solder application machine having means for applying a second amount of cream solder on the first side of the printed-circuit board after the first amount of cream solder has been printed by said cream solder printer, said solder application machine including an imprint plate with a hole for holding the second amount of cream solder and a push-pin for piercing a hole which is made in said imprint plate and is filled with cream solder for applying the cream solder onto the printed-circuit board, with said second amount of cream solder being greater than the first amount of cream solder printed by said cream solder printer, said second amount of cream solder to be applied in a vicinity of the holes in the printed-circuit board utilizing said push-pin;

a deformed part insertion machine operatively associated with said solder application machine, said deformed part insertion machine having means for inserting pins of a deformed part into the holes of the printed-circuit board from the second side of the printed-circuit board; and a second reflow furnace operatively associated with said deformed part insertion machine, said second reflow furnace having means for reflow soldering the second amount of cream solder, thereby fixedly securing the pins of the deformed part to the printed-circuit board.

41. An apparatus for manufacturing an electronic unit from a printed-circuit board having opposing first and second sides and a plurality of holes, said apparatus comprising:

a cream solder printer for printing a first amount of cream solder on the first side of the printed-circuit board;

a chip placement machine operatively associated with said cream solder printer, said chip placement machine having means for placing a plane-mounted part on the printed-circuit board on which the first amount of cream solder is printed;

a first reflow furnace operatively associated with said chip placement machine, said first reflow furnace having means for fixedly securing the plane-mounted part to the printed-circuit board;

a solder application machine operatively associated with said first reflow furnace, said solder application machine having means for applying a second amount of cream solder on the first side of the printed-circuit board after the first amount of cream solder has been printed by said cream solder printer, said solder application machine including an imprint plate with a hole for holding the second amount of cream solder and a push-pin for piercing a hole which is made in said imprint plate and is filled with cream solder for applying the cream solder onto the printed-circuit board, with said second amount of cream solder being larger than the first amount of cream solder printed by said cream solder printer, said second amount of cream solder to be applied to surround the holes in the printed-circuit board utilizing said push-pin;

a deformed part insertion machine operatively associated with said solder application machine, said deformed part insertion machine having means for inserting pins of a deformed part into the holes of the printed-circuit board from the second side of the printed-circuit board;

a frame assembling machine operatively associated with said deformed part insertion machine, said frame assembling machine having means for placing a frame on the printed-circuit board with the deformed part;

a second reflow furnace operatively associated with said frame assembling machine, said second reflow furnace having means for fixedly securing the deformed part and the frame to the printed-circuit board.

\* \* \* \* \*

UNITED STATES PATENT AND TRADEMARK OFFICE
CERTIFICATE OF CORRECTION

PATENT NO.     : 6,493,928 B1
DATED          : December 17, 2002
INVENTOR(S)    : Tashiharu Shinbo et al.

It is certified that error appears in the above-identified patent and that said Letters Patent is hereby corrected as shown below:

<u>Title page,</u>
Item [54], Title, after "APPARATUS", please insert -- AND METHOD --.

<u>Column 22,</u>
Line 61, please delete "fi&mace", and insert therefor -- furnace --.

Signed and Sealed this

Fifteenth Day of April, 2003

JAMES E. ROGAN
*Director of the United States Patent and Trademark Office*